(12) United States Patent
Kawashima et al.

(10) Patent No.: US 10,110,113 B2
(45) Date of Patent: Oct. 23, 2018

(54) ACTIVE FILTER AND AC-DC CONVERSION DEVICE

(71) Applicant: DAIKIN INDUSTRIES, LTD., Osaka-Shi, Osaka (JP)

(72) Inventors: Reiji Kawashima, Osaka (JP); Takayuki Fujita, Osaka (JP)

(73) Assignee: DAIKIN INDUSTRIES, LTD., Osaka-Shi (JP)

( * ) Notice: Subject to any disclaimer, the term of this patent is extended or adjusted under 35 U.S.C. 154(b) by 0 days.

(21) Appl. No.: 15/519,315

(22) PCT Filed: Sep. 29, 2015

(86) PCT No.: PCT/JP2015/077556
§ 371 (c)(1),
(2) Date: Apr. 14, 2017

(87) PCT Pub. No.: WO2016/059969
PCT Pub. Date: Apr. 21, 2016

(65) Prior Publication Data
US 2017/0237334 A1      Aug. 17, 2017

(30) Foreign Application Priority Data

Oct. 15, 2014   (JP) ................................. 2014-210821
Apr. 8, 2015    (JP) ................................. 2015-078968

(51) Int. Cl.
*H02M 1/12*       (2006.01)
*H02M 5/458*      (2006.01)
(Continued)

(52) U.S. Cl.
CPC ................ *H02M 1/12* (2013.01); *H02K 7/14* (2013.01); *H02M 1/084* (2013.01); *H02M 5/458* (2013.01); *H02P 27/06* (2013.01)

(58) Field of Classification Search
CPC .......... H02M 1/084; H02M 1/12; H02M 1/42; H02M 5/458; H02M 7/155; H02M 7/162; H02M 2001/12; H02P 27/06; H02K 7/14
See application file for complete search history.

(56) References Cited

U.S. PATENT DOCUMENTS 4,928,052 A * 5/1990 Fujioka ................... H02P 23/06
                                                         318/759
5,864,474 A * 1/1999 Jang ......................... H02J 3/32
                                                         187/296
(Continued)

FOREIGN PATENT DOCUMENTS

CN       201051718 Y    4/2008
CN       102044974 A    5/2011
(Continued)

*Primary Examiner* — Matthew Nguyen
(74) *Attorney, Agent, or Firm* — Birch, Stewart, Kolasch & Birch, LLP

(57) ABSTRACT

An active filter is connected in parallel to a rectifier circuit between a set of AC input lines and a pair of DC buses. The active filter includes a capacitor, a pair of current limiting elements and an inverter. One in the current limiting elements is disposed between one end of the capacitor and one in the DC buses. Other in the current limiting elements is disposed between other end of the capacitor and other in the DC buses. At least one of the current limiting elements is disposed in an orientation to be forward with respect to a DC voltage outputted by the rectifier circuit. The inverter includes: a set of AC-side terminals connected to the set of AC input lines; and a pair of DC-side terminals connected to both ends of the capacitor.

16 Claims, 41 Drawing Sheets

(51) Int. Cl.
*H02M 1/084* (2006.01)
*H02P 27/06* (2006.01)
*H02K 7/14* (2006.01)

(56) References Cited

U.S. PATENT DOCUMENTS

| | | | |
|---|---|---|---|
| 2004/0160789 A1* | 8/2004 | Ying | H02J 9/061 363/16 |
| 2010/0141187 A1 | 6/2010 | Chang | |
| 2011/0038185 A1* | 2/2011 | Swamy | H02J 7/045 363/34 |
| 2016/0226425 A1 | 8/2016 | Kawashima | |

FOREIGN PATENT DOCUMENTS

| | | |
|---|---|---|
| EP | 1 643 631 A1 | 4/2006 |
| GB | 2 427 512 A | 12/2006 |
| JP | 8-251947 A | 9/1996 |
| JP | 2001-145357 A | 5/2001 |
| JP | 2002-51589 A | 2/2002 |
| JP | 2005-223999 A | 8/2005 |
| JP | 2006-109558 A | 4/2006 |
| JP | 4284053 B2 | 6/2009 |
| JP | 4411845 B2 | 2/2010 |
| JP | 2015-92813 A | 5/2015 |
| WO | WO 2008/155446 A1 | 12/2008 |

* cited by examiner

F I G. 1
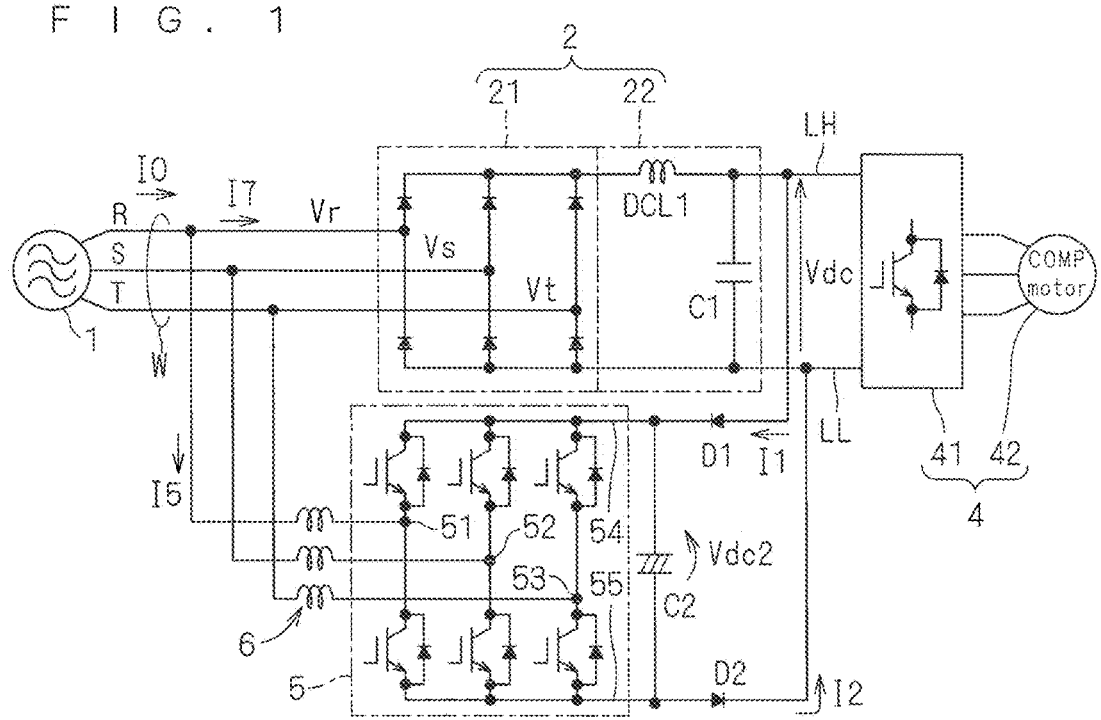
F I G. 2
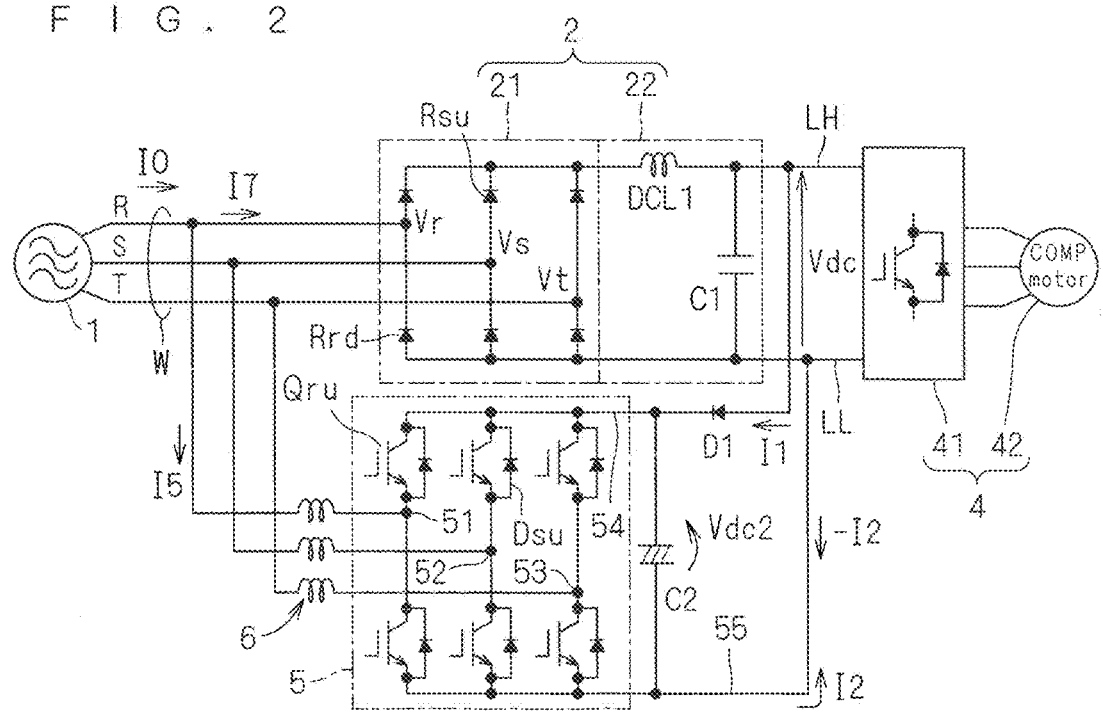

F I G. 7
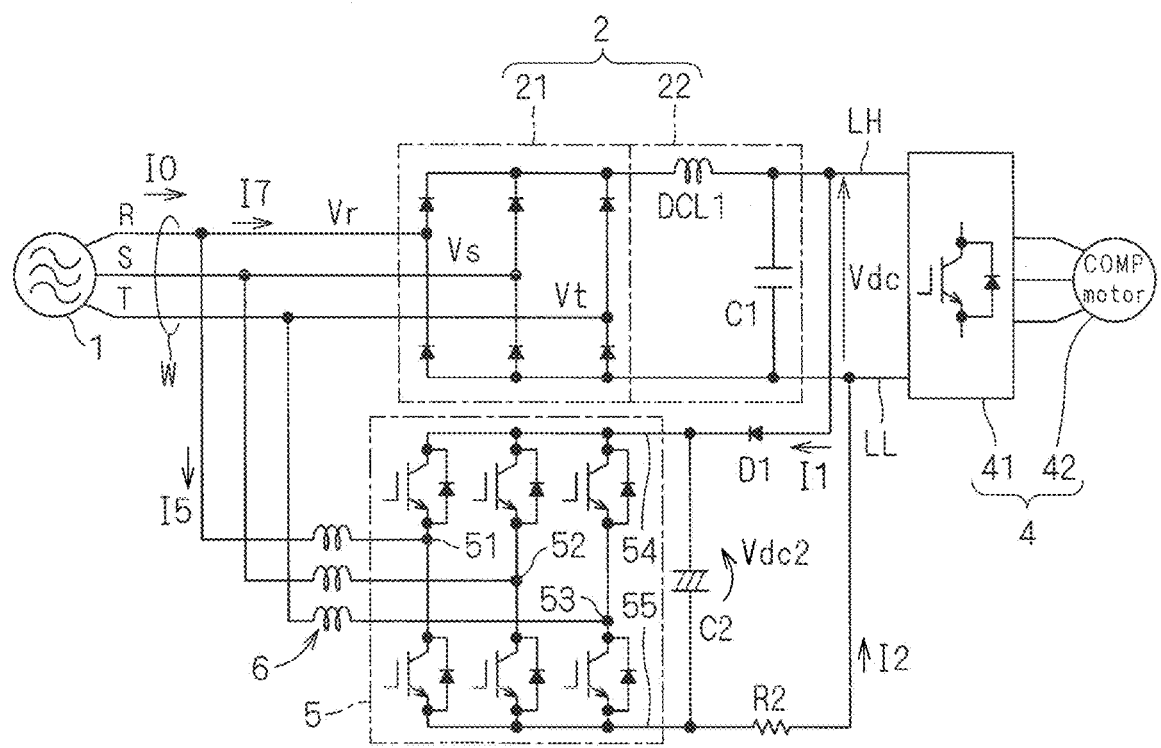

F I G. 9
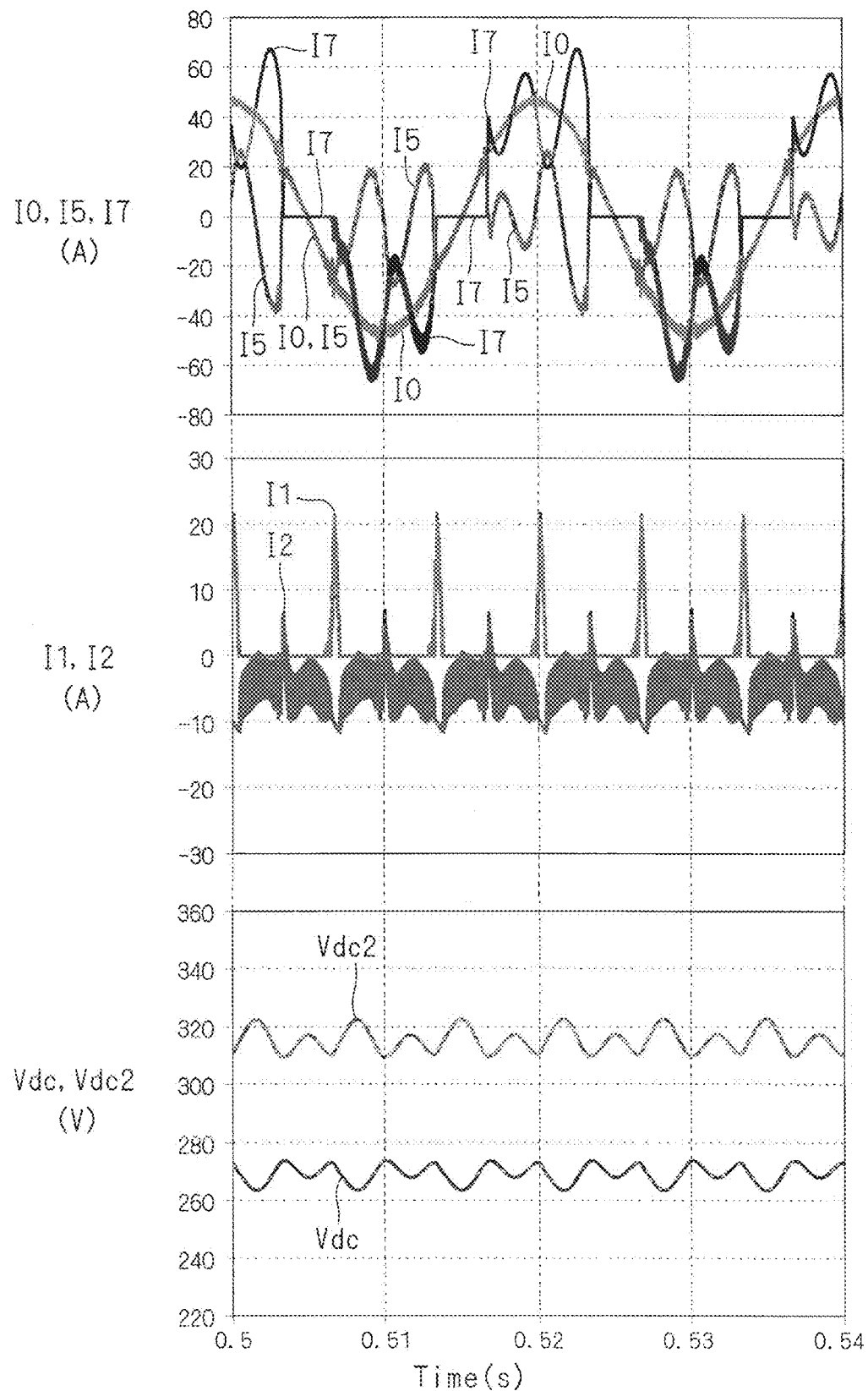

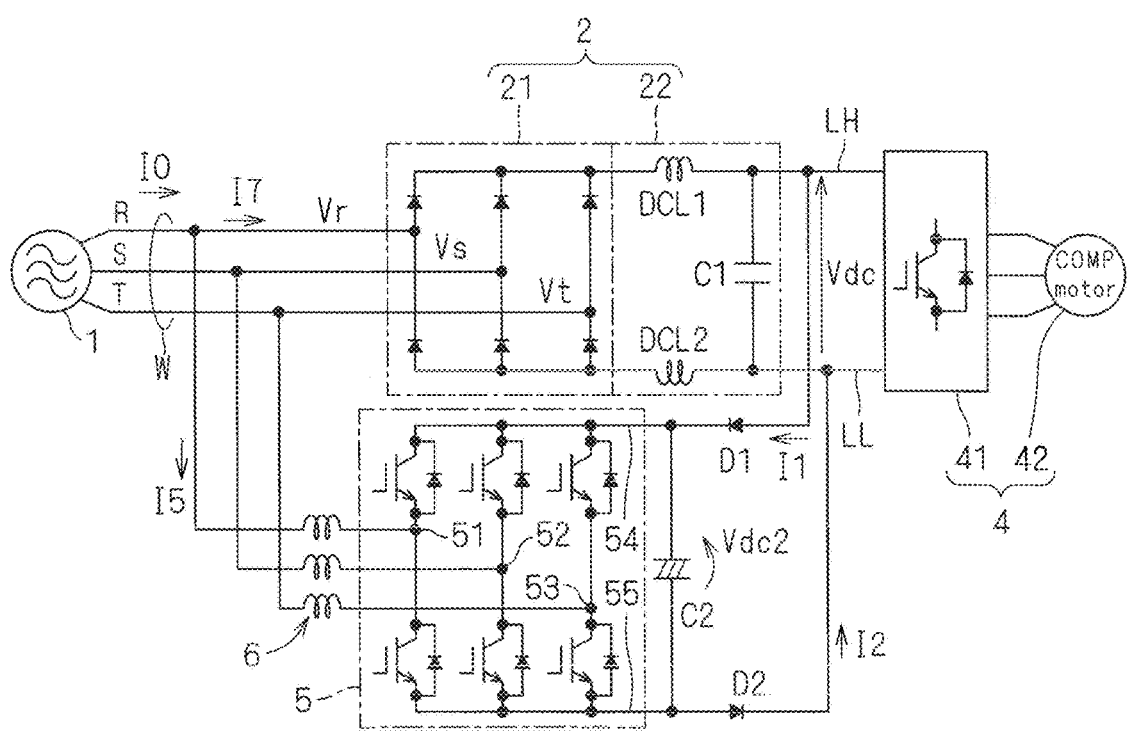
F I G. 1 0

F I G. 1 3
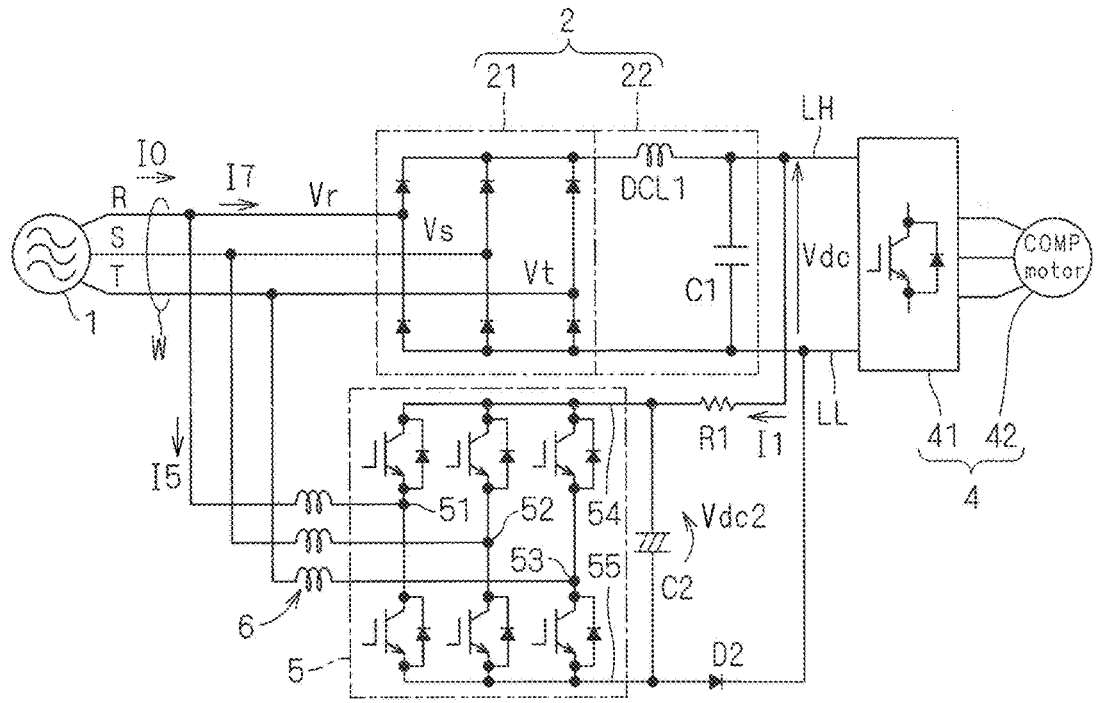
F I G. 1 4
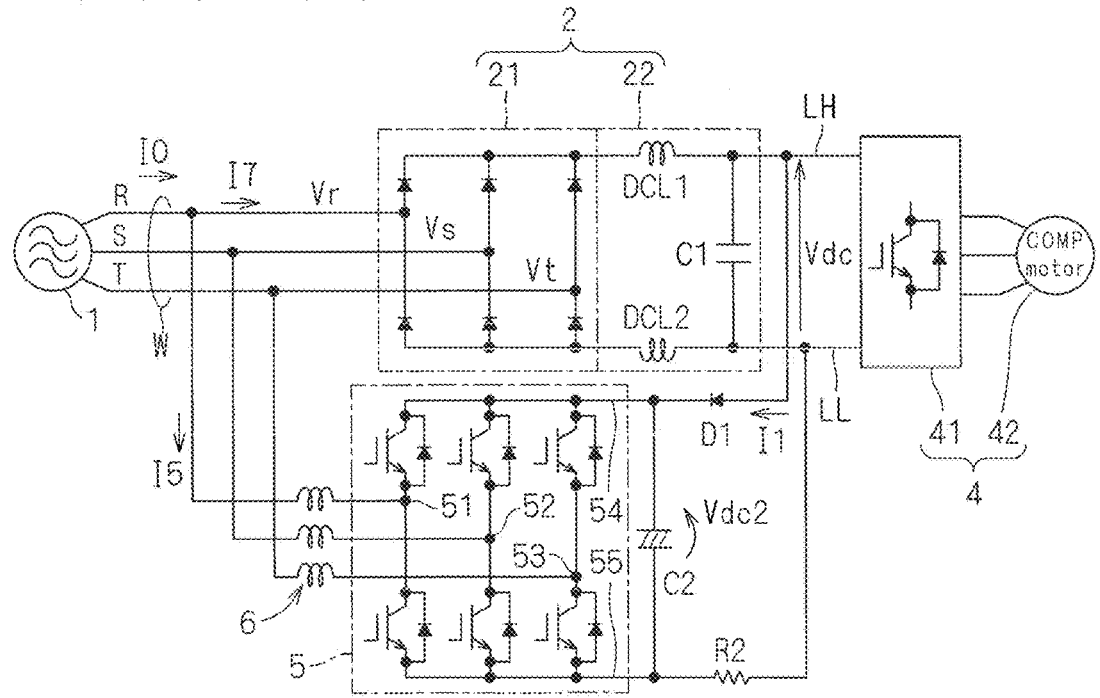

F I G. 1 5
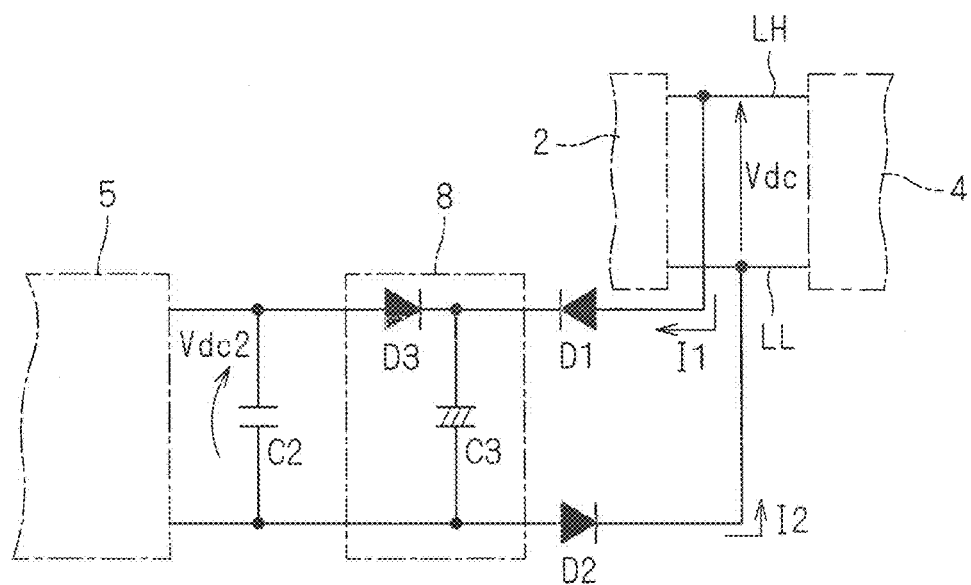

F I G. 1 9
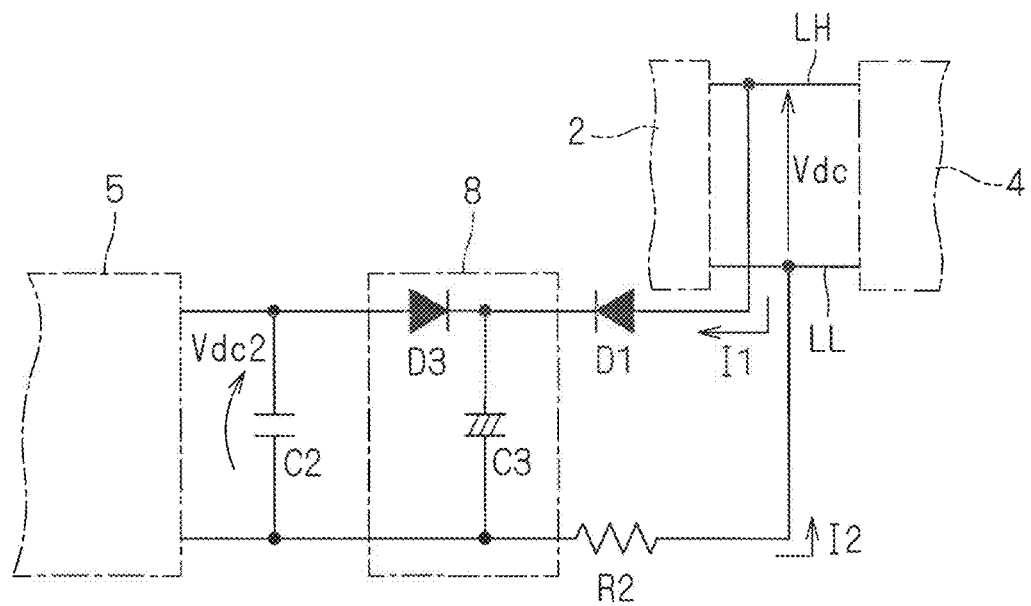

F I G . 2 3
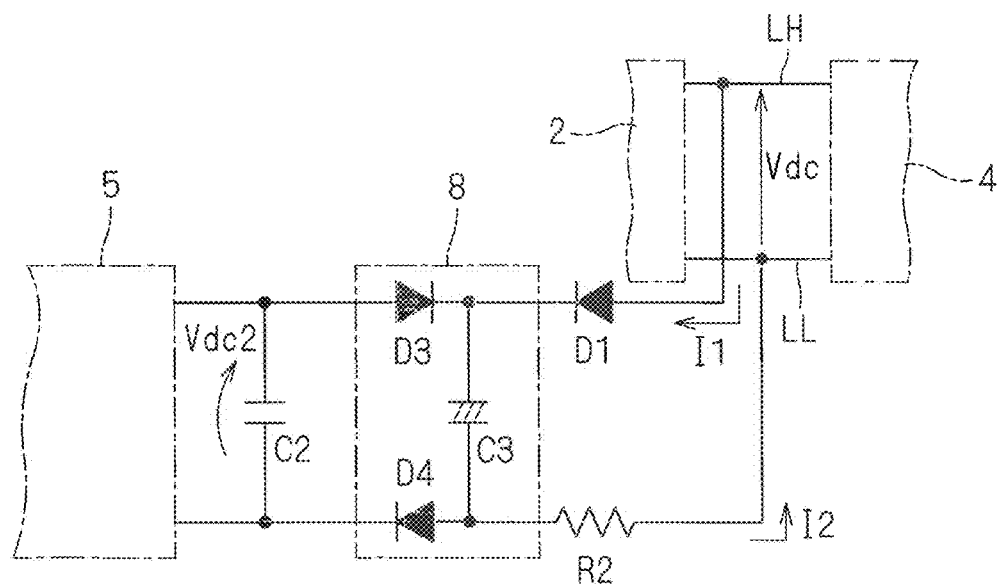

F I G. 2 6
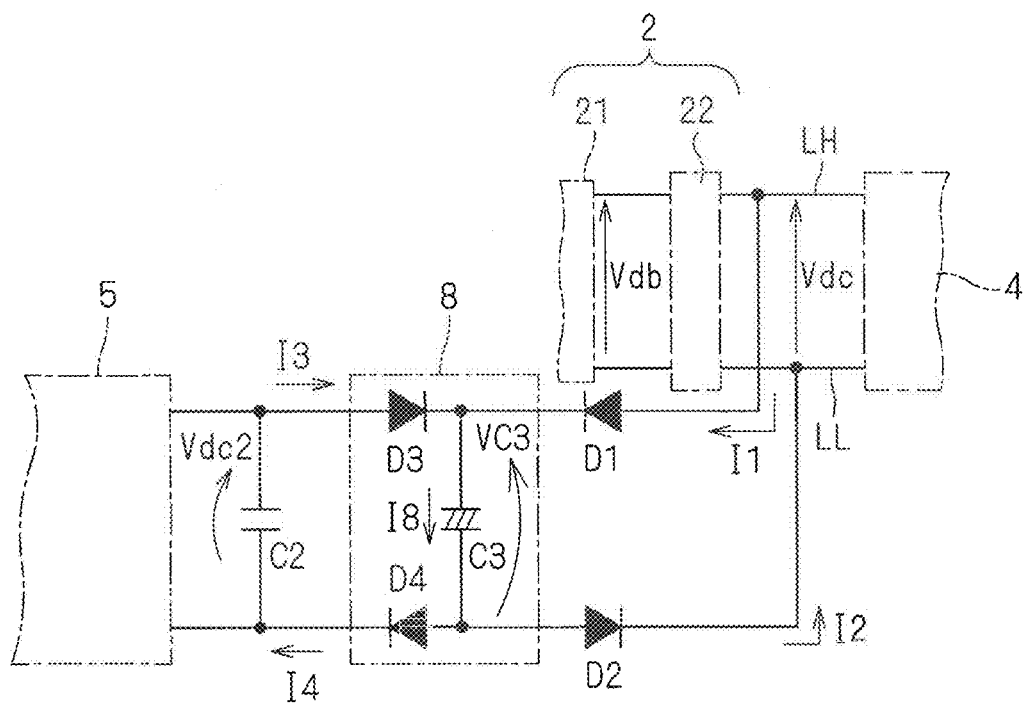

F I G. 2 7
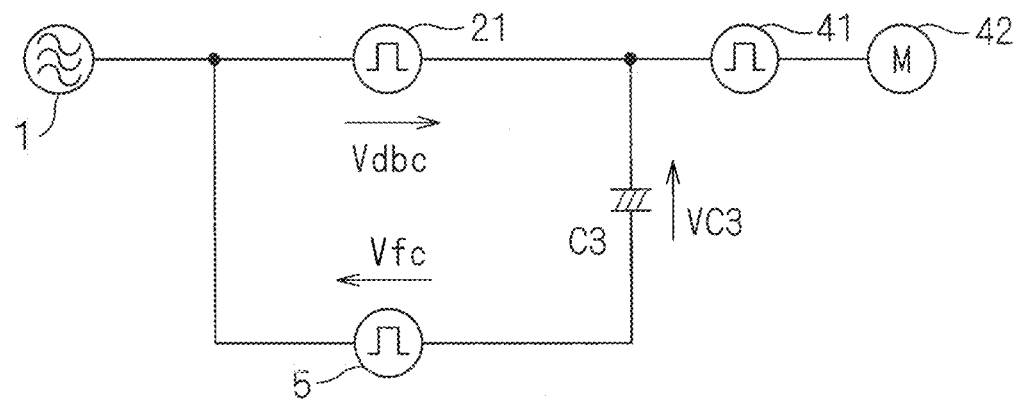

F I G. 3 1
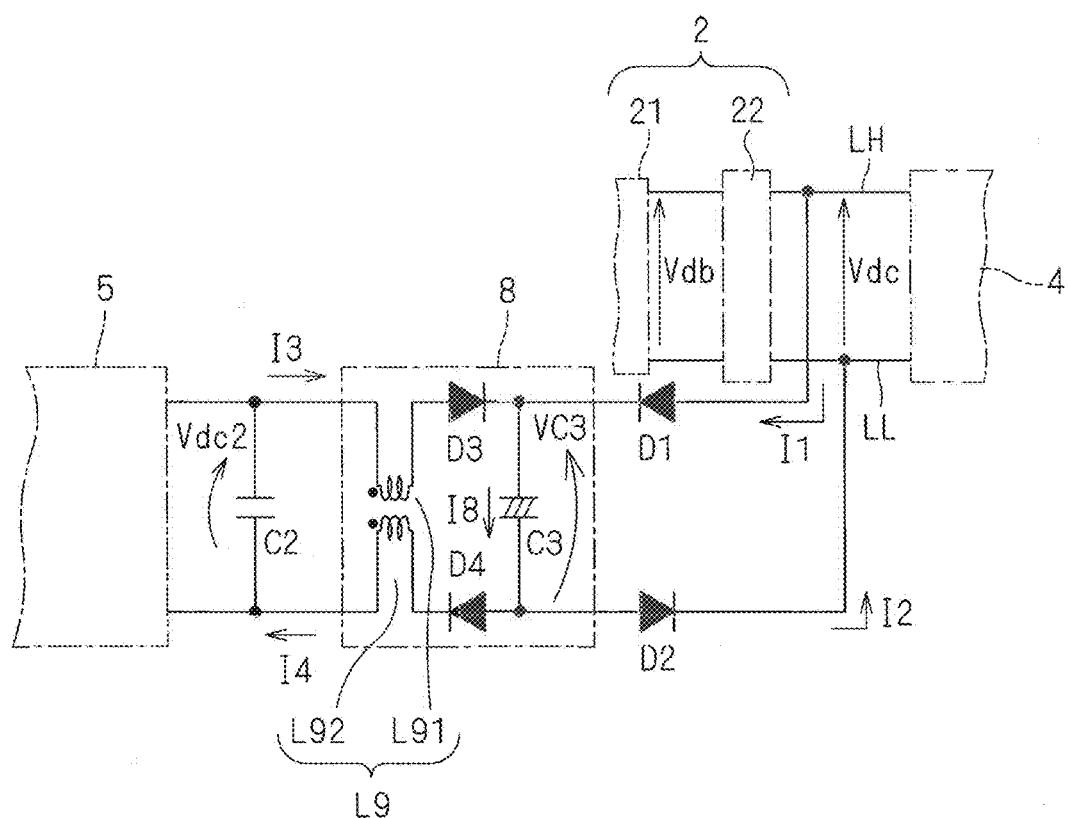

F I G. 3 2
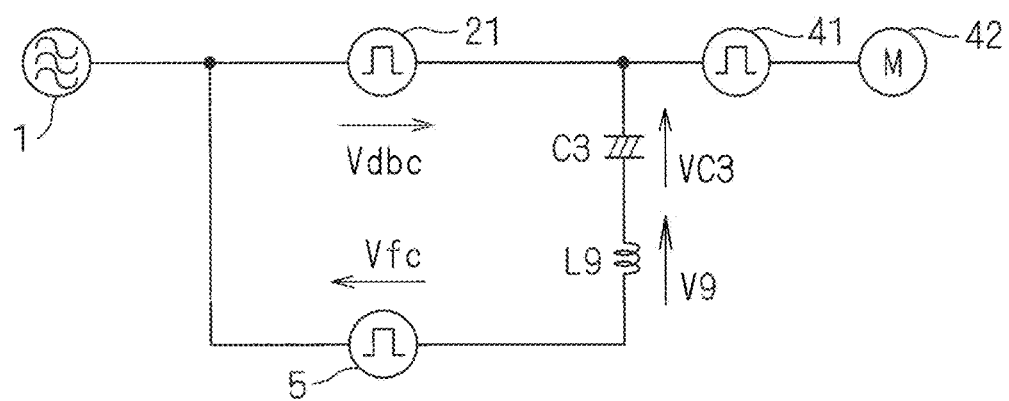

F I G . 3 3
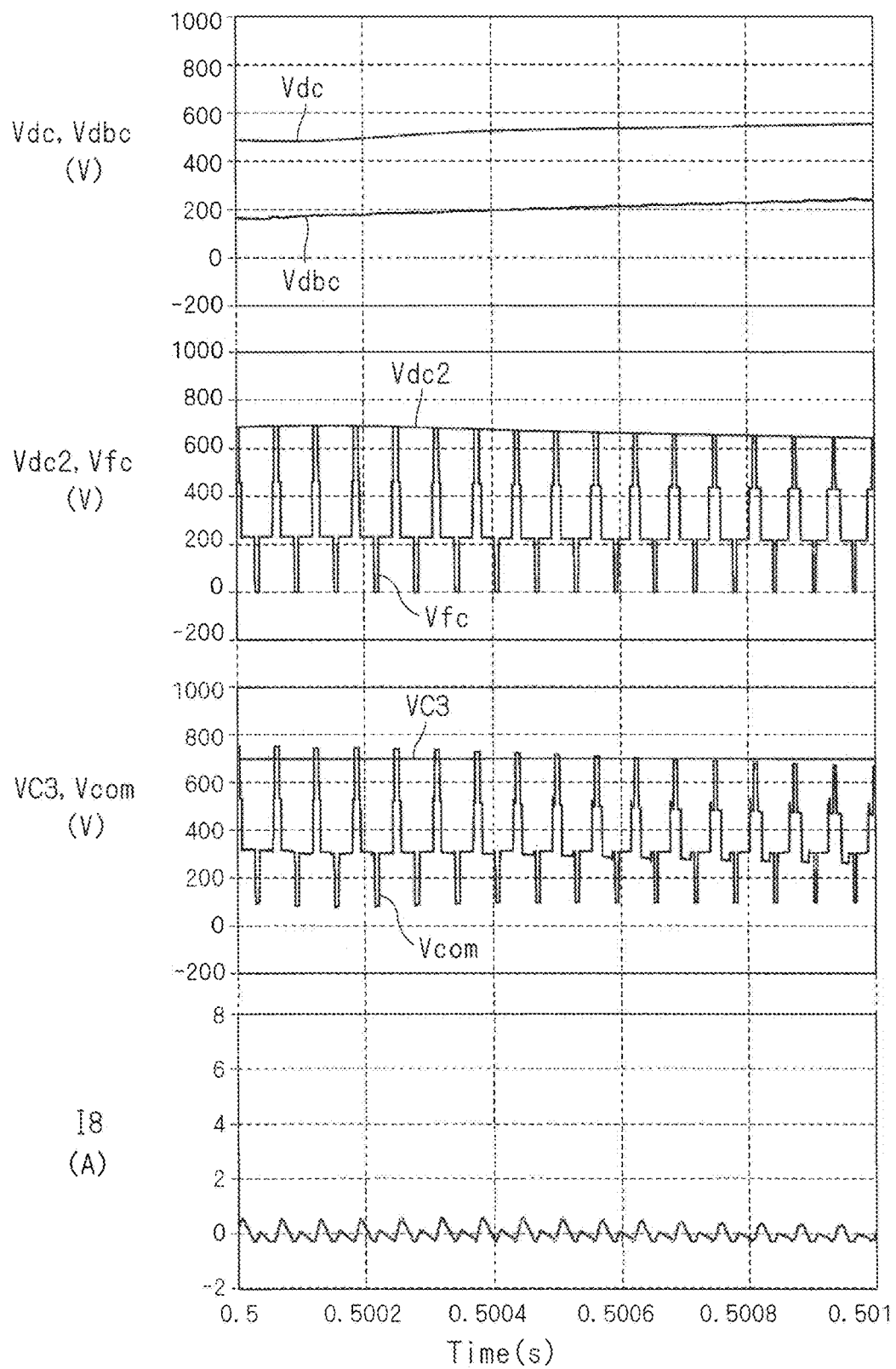

F I G. 3 6
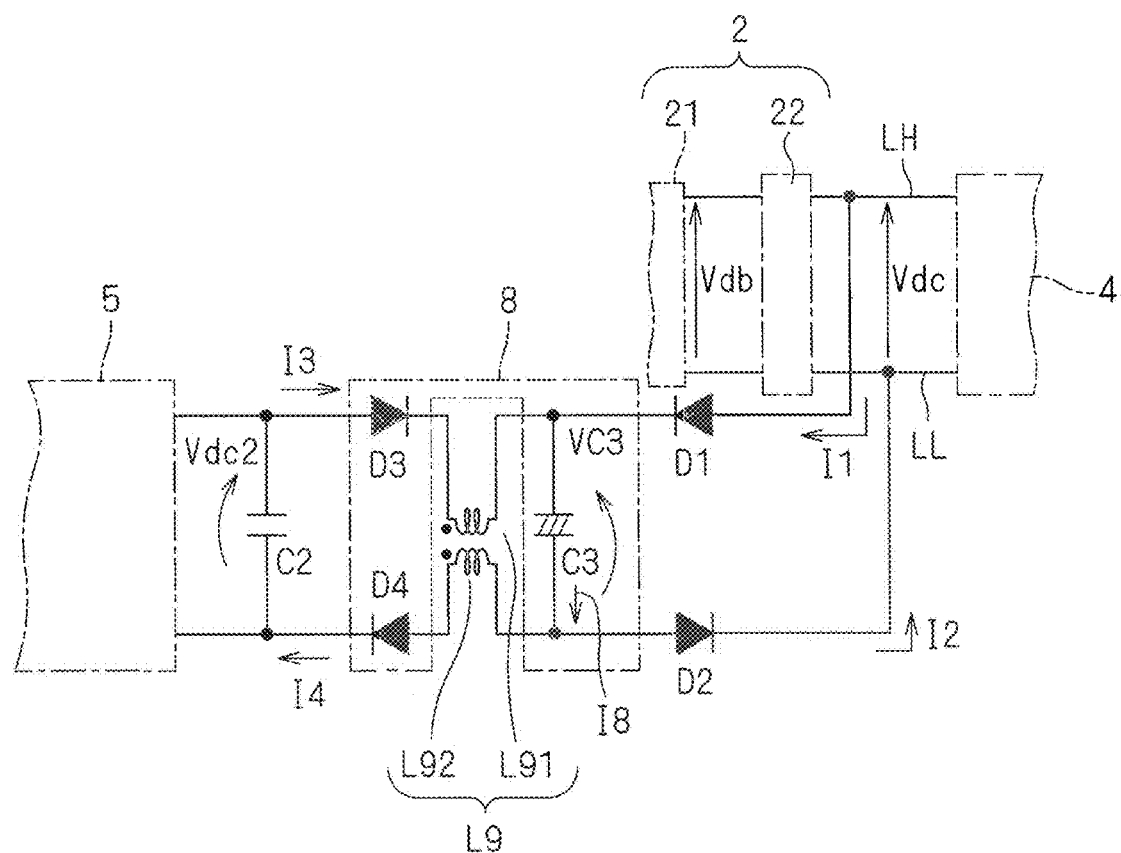

F I G . 4 1
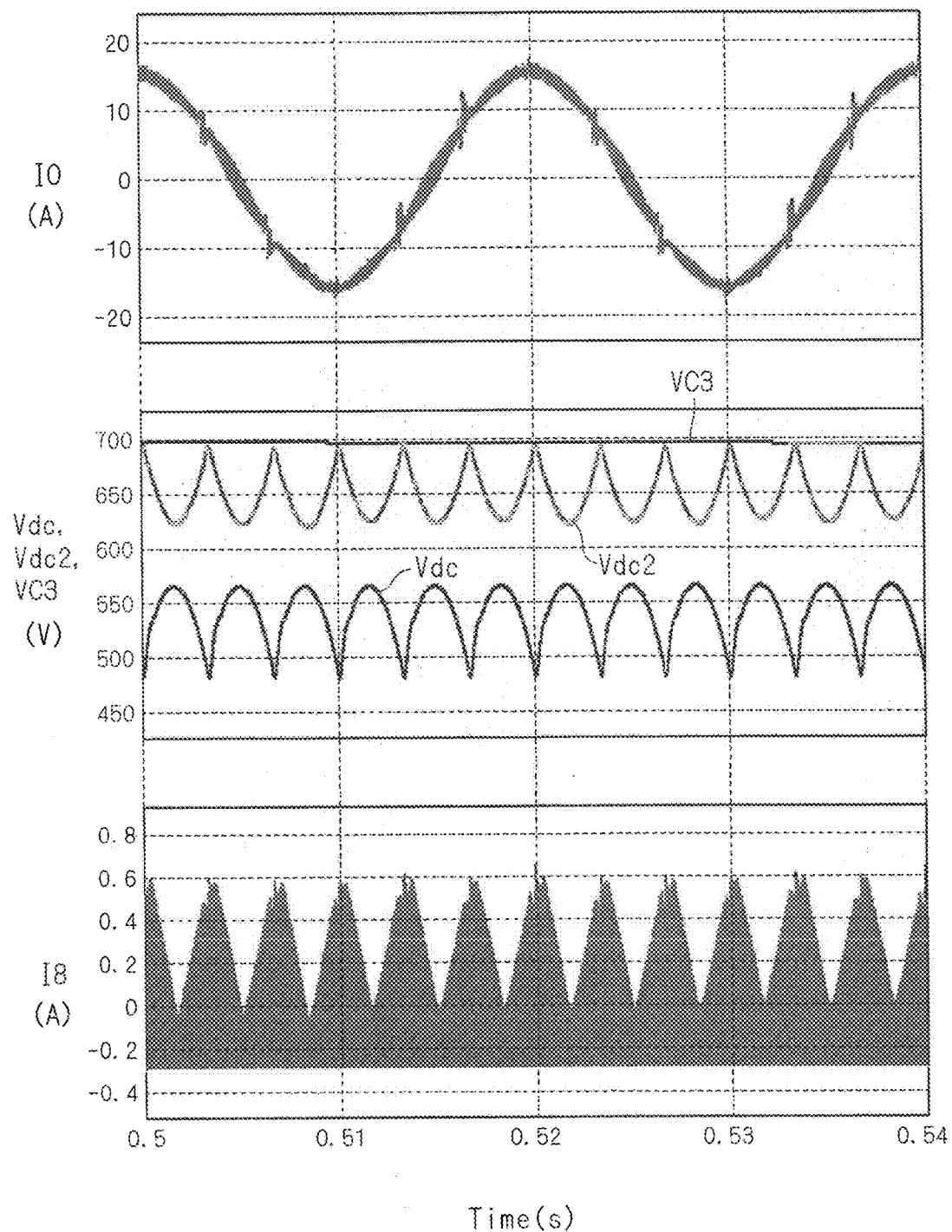

ACTIVE FILTER AND AC-DC CONVERSION DEVICE

TECHNICAL FIELD

The present invention relates to an active filter, and particularly, relates to a parallel active filter.

BACKGROUND ART

A technology for compensating a harmonic current by using an active filter and thereby suppressing harmonics is introduced, for example, in Japanese Patent No. 4411845, Japanese Patent No. 4284053, and Japanese Patent Application Laid-Open No. 2005-223999.

In Japanese Patent No. 4411845, a DC voltage, which is boosted by a boost chopper and is given to a smoothing capacitor, is directly applied to an active filter.

In Japanese Patent No. 4284053, a DC voltage, which is obtained by rectifying an AC voltage boosted by a transformer and is given to a DC smoothing capacitor, is directly applied to an active filter as a voltage type self-excited power converter.

In Japanese Patent Application Laid-Open No. 2005-223999, an inverter-side capacitor is disposed between a transformer and an inverter, and is connected in parallel to a rectifier-side capacitor via one protection diode.

In Japanese Patent Application Laid-Open No. 2002-51589, a so-called electrolytic capacitor-less inverter is disclosed.

SUMMARY OF INVENTION

Problems to be Solved by the Invention

In the technologies described in Japanese Patent No. 4411845 and Japanese Patent No. 4284053, even if the compensation for the harmonic current is appropriate, the boost chopper and the transformer are required. Japanese Patent Application Laid-Open No. 2005-223999 introduces a simple technology in which one diode is provided between the capacitors connected in parallel; however, a DC voltage given to the active filter becomes insufficient, and eventually, an appropriate compensating current is not obtained.

The present invention has been made in consideration of the above-described circumstances, and it is an object of the present invention to provide a technology for increasing the DC voltage, which is given to the active filter, by means of a simple configuration.

Means for Solving the Problems

The active filter according to the present invention is connected in parallel to a rectifier circuit (2) between a set of AC input lines (W) and a pair of DC buses (LH, LL) between which a load (4) is connected, the rectifier circuit rectifying AC voltages (Vr, Vs, Vt) inputted from the set of AC input lines and outputting a DC voltage (Vdc) to the pair of DC buses.

Then, a first aspect of the active filter includes: a first capacitor (C2); a pair of current limiting elements (D1, D2, R2), each of which connects each of a pair of ends of the first capacitor to each of the pair of DC buses, and at least one of which is a diode (D1) disposed in an orientation to be forward with respect to the DC voltage; and an inverter (5) including a set of AC-side terminals (51, 52, 53) connected to the set of AC input lines, a pair of DC-side terminals (54, 55) connected to both ends of the first capacitor, a plurality of switching elements, each of which connects each of the AC-side terminals and each of the DC-side terminals to each other, and a plurality of diodes, each of which is connected in anti-parallel to each of the switching elements.

For example, each of the pair of current limiting elements is the diode (D1, D2) disposed in the orientation to be forward with respect to the DC voltage. Alternatively, for example, other in the pair of current limiting elements is a resistor (R2).

A second aspect of the active filter according to the present invention is the first aspect thereof, wherein the rectifier circuit (2) includes a diode bridge (21) and a low-pass filter (22), the low-pass filter (22) is provided between the diode bridge (21) and the pair of DC buses (LH, LL), and the diode bridge (21) is provided between the set of AC input lines (W) and the low-pass filter (22). The low-pass filter includes: a first reactor (DCL1) provided between one (LH) in the pair of DC buses and the diode bridge (21); a second reactor (DCL2) provided between other (LL) in the pair of DC buses and the diode bridge (21); and a second capacitor (C1) provided between the pair of DC buses (LH, LL).

A third aspect of the active filter according to the present invention is either one of the first aspect and second aspect thereof, further including: a clamp circuit (8), which is provided between the first capacitor (C2) and the pair of current limiting elements (D1, D2, R2), and includes at least one (D3) of clamping diodes reverse to the DC voltage (Vdc), and a clamping capacitor (C3) connected in parallel to the first capacitor via the clamping diode more on the first capacitor side than the one in the pair of current limiting elements. The pair of current limiting elements are connected in series to the clamping capacitor between the pair of DC buses, and the one (D1) in the pair of current limiting elements is connected to one in a pair of ends of the first capacitor via the clamping diode.

A fourth aspect of the active filter according to the present invention is the third aspect thereof, wherein the clamp circuit (8) further includes other clamping diode (D4), which is connected in series to the clamping diode (D3) and the clamping capacitor (C3) between the pair of ends of the first capacitor (C2) and is reverse to the DC voltage (Vdc).

A fifth aspect of the active filter according to the present invention is either one of the third and fourth aspects, further including: a third reactor (L91) and a fourth reactor (L92), which are inductively coupled to each other at a same polarity. The third reactor is connected in series to the one (D1) in the pair of current limiting elements between the one in the pair of ends of the first capacitor (C2) and one (LH) of the DC buses, and the fourth reactor is connected in series to other (D2, R2) in the pair of current limiting elements between other in the pair of ends of first capacitor (C2) and other (LL) in the DC buses. Each of the third reactor and the fourth reactor is on the first capacitor (C2) side with respect to the clamping capacitor (C3), or on an opposite side to the first capacitor.

An AC-DC conversion device may be composed by including: the active filter according to the present invention; and the rectifier circuit (2).

Effects of the Invention

In accordance with the first aspect of the active filter according to the present invention, by such a configuration in which the first capacitor usually provided in the active filter is connected to the pair of DC buses via the pair of current limiting elements, a voltage higher than the voltage between the DC buses is obtained in the first capacitor, and the suppression of the harmonic current can be performed.

In accordance with the second aspect of the active filter according to the present invention, a carrier component for use in controlling the inverter is reduced in the current flowing through the AC input lines.

In accordance with the third aspect of the active filter according to the present invention, even if an electrostatic capacitance of each of the first capacitor and the second capacitor is reduced, fluctuations of the voltage of each thereof are suppressed.

In accordance with the fourth aspect of the active filter according to the present invention, current capacities of the clamping diode and the diodes, which serve as the current limiting elements, are reduced.

In accordance with the fifth aspect of the active filter according to the present invention, a power capacity required for the clamping capacitor is reduced.

Objects, features, aspects and advantages of the present invention will be more obvious by the following detailed description and the accompanying drawings.

BRIEF DESCRIPTION OF DRAWINGS

FIG. 1 is a circuit diagram showing a motor drive system in which an active filter according to a first embodiment is adopted;

FIG. 2 is a circuit diagram showing a motor drive system in which an active filter serving as a comparative example is adopted;

FIG. 7 is a circuit diagram showing a motor drive system in which an active filter according to a second embodiment is adopted;

FIGS. 8 and 9 are graphs showing currents and voltages of respective portions in the motor drive system in which the active filter according to the second embodiment is adopted;

FIG. 10 is a circuit diagram showing a motor drive system in which an active filter according to a third embodiment is adopted;

FIG. 13 is a circuit diagram showing a motor drive system in which an active filter according to a first modification example is adopted;

FIG. 14 is a circuit diagram showing a motor drive system in which an active filter according to a second modification example is adopted;

FIG. 15 is a circuit diagram partially showing a configuration of an active filter according to a fourth embodiment;

FIG. 19 is a circuit diagram partially showing a configuration of an active filter serving as a fourth modification example;

FIG. 23 is a circuit diagram partially showing a configuration of an active filter serving as a fifth modification example;

FIG. 26 is a circuit diagram partially showing a configuration of an active filter according to a sixth embodiment;

FIG. 27 is a circuit diagram showing an equivalent circuit in the motor drive system in which the active filter according to the sixth embodiment is adopted;

FIG. 31 is a circuit diagram partially showing a configuration of the active filter according to the sixth embodiment;

FIG. 32 is a circuit diagram showing an equivalent circuit in a motor drive system in which the active filter according to the sixth embodiment is adopted;

FIG. 33 is a graph explaining a common mode noise in the sixth embodiment;

FIG. 36 is a circuit diagram partially showing a configuration of an active filter serving as a seventh modification example;

FIG. 41 is a graph showing currents and voltages of the respective portions in the motor drive system in which the active filter serving as the ninth modification example is adopted;

DESCRIPTION OF EMBODIMENTS

First Embodiment

Figure 3:
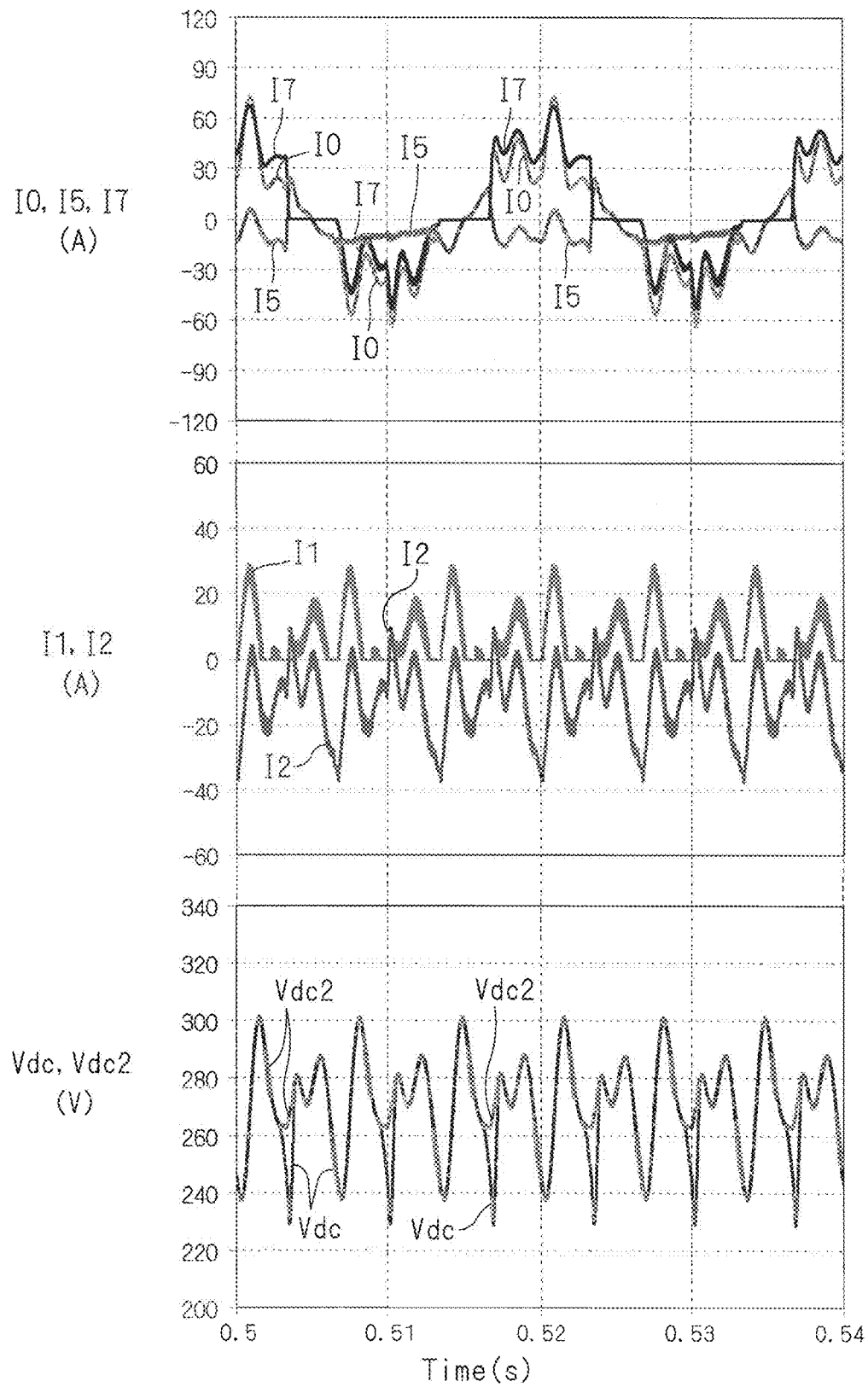
FIGS. 3 and 4 are graphs showing currents and voltages of respective portions in the motor drive system in which the active filter serving as the comparative example is adopted.

FIG. 1 is a circuit diagram showing a motor drive system in which an active filter according to a first embodiment is adopted.

In the motor drive system, a rectifier circuit 2 rectifies three-phase AC voltages Vr, Vs and Vt, and outputs a DC voltage Vdc to a pair of DC buses LH and LL. A load 4 is connected between the pair of DC buses LH and LL. The voltages Vr, Vs and Vt are given from an AC power supply 1 via a set of AC input lines W.

Then, the active filter is a so-called parallel active filter, which is connected in parallel to the rectifier circuit 2 between the set of AC input lines W and the pair of DC buses LH and LL.

The active filter includes: an inverter 5; a capacitor C2; and a pair of current limiting elements. Either one in the pair of current limiting elements is a diode, and in the first embodiment, a case where the pair of current limiting elements is a pair of diodes is illustrated.

The pair of diodes are diodes D1 and D2, respectively. Each of these connects each of a pair of ends of the capacitor C2 to each of the pair of DC buses LH and LL. Then, each of the diodes D1 and D2 is disposed in an orientation to be forward with respect to the DC voltage Vdc.

Specifically, a potential of the DC bus LH is higher than a potential of the DC bus LL. An anode of the diode D1 and a cathode of the diode D2 are connected to the DC bus LH and the DC bus LL, respectively. A cathode of the diode D1 and an anode of the diode D2 are connected to a high potential-side end of the capacitor C2 and a low potential-side end of the capacitor C2, respectively.

The inverter 5 includes: a set of AC-side terminals 51, 52 and 53, which are connected to the set of AC input lines W via interconnection reactors 6; and a pair of DC-side terminals 54 and 55 connected to both ends of the capacitor C2. The inverter 5 further includes a plurality of switching elements, each of which connects each of the AC-side terminals 51, 52 and 53 and each of the DC-side terminals 54 and 55 to each other. In FIG. 1, these switching elements are shown as IGBTs (Insulated Gate Bipolar Transistors). The inverter 5 also further includes a plurality of diodes, each of which is connected in anti-parallel to each of these switching elements.

A configuration of such an inverter 5 and an operation itself thereof are known in public, and accordingly, a detailed description thereof is omitted here.

The rectifier circuit 2 includes: a diode bridge 21; and a low-pass filter 22. The low-pass filter 22 is provided between the diode bridge 21 and the pair of DC buses LH and LL. The diode bridge 21 is provided between the set of AC input lines W and the low-pass filter 22.

It is desirable that the low-pass filter 22 be provided from a viewpoint of suppressing a harmonic content caused by the switching of the inverter 5. However, the low-pass filter 22 is not essential in a function that the active filter compensates a harmonic current resulting from the load 4.

The low-pass filter 22 includes: a reactor DCL1 provided between the DC bus LH and the diode bridge 21; and a capacitor C1 provided between the pair of DC buses LH and LL. The reactor DCL1 may be provided between the DC bus LL and the diode bridge 21.

The load 4 is a DC load; however, the harmonic current flows therethrough. For example, the load 4 includes an inverter 41 and a motor 42. The inverter 41 converts the DC voltage Vdc into an AC voltage, and supplies the AC voltage to the motor 42. For example, the motor 42 is an AC motor that drives a compressor that compresses a refrigerant.

In order to explain effects of the active filter according to the first embodiment, a comparative example is introduced and described.

FIG. 2 is a circuit diagram showing a motor drive system in which an active filter serving as a comparative example with the first embodiment is adopted. The active filter shown in FIG. 2 corresponds to a structure in which the diode D2 of the active filter shown in FIG. 1 is short-circuited and removed.

That is, in the comparative example concerned, such low potential-side ends of the respective capacitors C1 and C2 are commonly connected to the DC bus LL.

Therefore, a current, which goes from the DC bus LL toward the DC-side terminal 55, and does not flow in the configuration according to the first embodiment, flows in a configuration according to the comparative example. Hereinafter, details will be described.

When a current I7 that flows from the AC power supply 1 via the rectifier circuit 2 to the load 4 and a current I5 that flows from the AC power supply 1 via the interconnection reactors 6 to the active filter (more specifically, the inverter 5) are introduced, then a current I0 (this is also a current that flows through the AC input lines W), which flows out of the AC power supply 1, becomes a sum of the current I7 and the current I5. Moreover, a current I1 that flows from the DC bus LH to the DC-side terminal 54 and a current I2 that flows from the DC-side terminal 54 to the DC bus LL are introduced.

However, while I2≥0 is established in the configuration according to the first embodiment, I2<0 can be established in the comparative example.

Hereinafter, a description will be made on the assumption that the voltage Vs of an S-phase is higher than the voltage Vr of an R-phase. Referring to FIG. 2, a component in the current I5, which flows from the S-phase to the R-phase, flows through an upper arm-side diode Dsu, which corresponds to the S-phase of the inverter 5, and through an upper arm-side switching element Qru, which corresponds to the R-phase and is conducting. A component in the current I7, which flows from the S-phase to the R-Phase, flows through an upper arm-side diode Rsu, which corresponds to the S-phase of the diode bridge 21, the reactor DCL1, and the diode D1. Then, a part of the component flows to the capacitor C2, and other part flows through the upper arm-side switching element Qru. The description of these currents is similar between the configuration according to the first embodiment and the configuration according to the comparative example.

Incidentally, in the configuration according to the comparative example, the current I2 can become negative as mentioned above, and accordingly, the current I2 can flow through the upper arm-side switching element Qru from the DC bus LL via the capacitor C2. In this way, a voltage Vdc2 held by the capacitor C2 becomes substantially equal to the DC voltage Vdc held by the capacitor C1. This is because, since a current for charging the capacitor C2 is substantially a sum of the currents I1 and I2, the capacitor C2 becomes harder to charge as a value of the current I2 is smaller (as an absolute value is larger if the value is negative).

When the voltage Vdc2 is substantially equal to the DC voltage Vdc, the current I5 for compensating the harmonic current cannot be made to flow appropriately. This is a problem already pointed out for Japanese Patent Application Laid-Open No. 2005-223999.

FIG. 3 is a graph showing the currents and voltages of the respective portions in the configuration serving as the comparative example. With regard to a waveform of the current I2 shown on a second tier, a period while the current I2 becomes negative is long. In this way, as shown on a third tier, the voltage Vdc2 remains only slightly beyond the DC voltage Vdc.

Moreover, as shown on a first tier, the current I2 flows, whereby the current I7 is also disturbed largely, the compensation of the harmonic current by the current I5 is not sufficient, and eventually, the current I0 exhibits a waveform that is largely out of the sinusoidal wave. Note that, with regard to waveforms of the currents I0, I5 and I7, a waveform for one phase, for example, the R-phase is shown. The same applies to other drawings.

As measures for increasing the voltage Vdc2 more than the DC voltage Vdc, there is mentioned such an operation of suppressing pulsation of the DC voltage Vdc by increasing an electrostatic capacitance of the capacitor C1.

Figure 4:
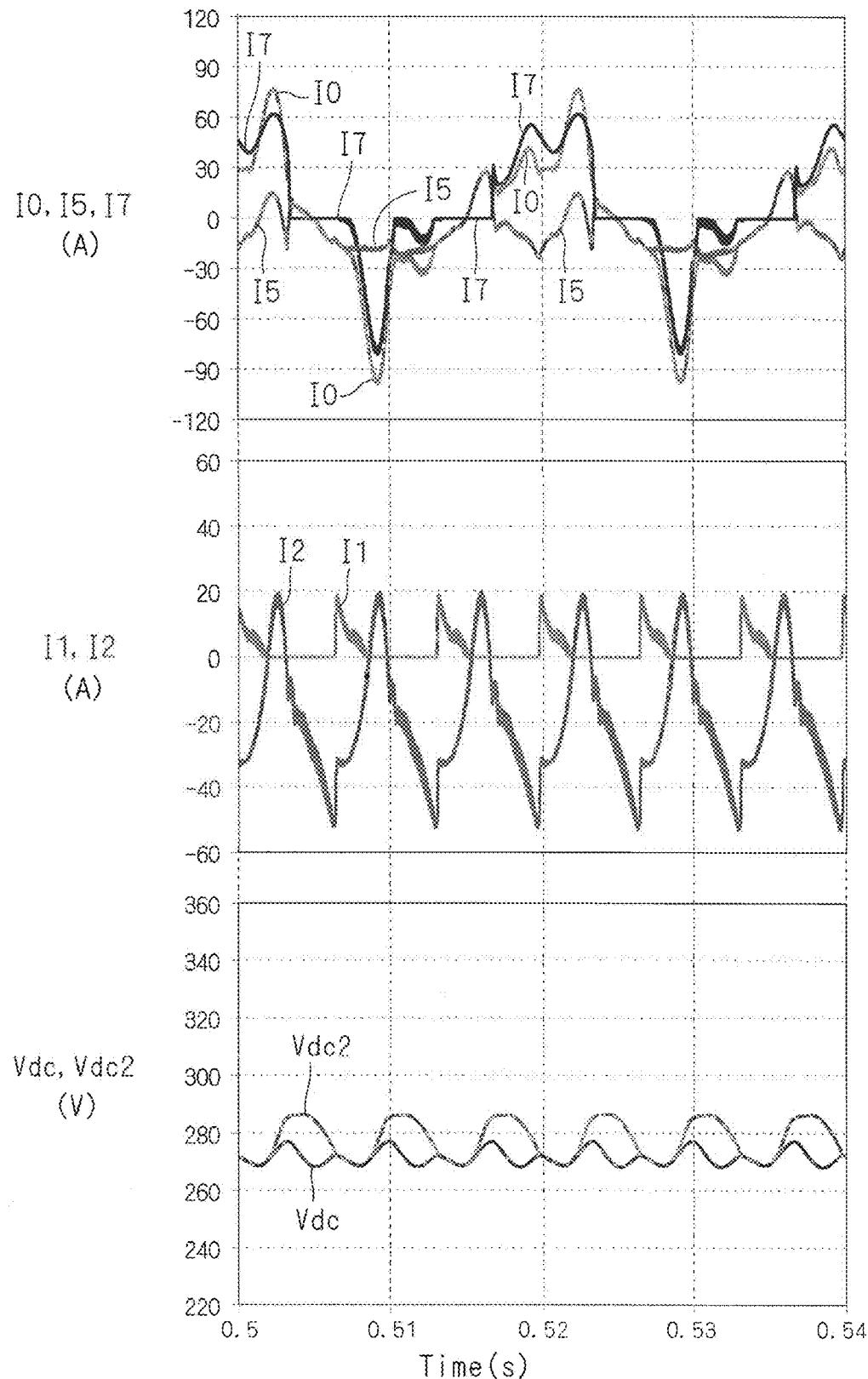

FIG. 4 is a graph showing currents and voltages of the respective portions in the configuration serving as the comparative example. Here, the electrostatic capacitance of the capacitor C1 is selected to be larger in a case (several thousand μF) shown in FIG. 4 in comparison with a case (several ten μF) shown in FIG. 3.

In comparison between FIG. 3 and FIG. 4, it is seen that the period while the current I2 is negative is reduced by increasing the electrostatic capacitance of the capacitor C1. However, a period while the DC voltage Vdc and the voltage Vdc2 coincide with each other is present, and moreover, an increment of the voltage Vdc2 with respect to the DC voltage Vdc is also insufficient. Therefore, the waveform of the current I0 is largely out of the sinusoidal wave.

Figure 5:
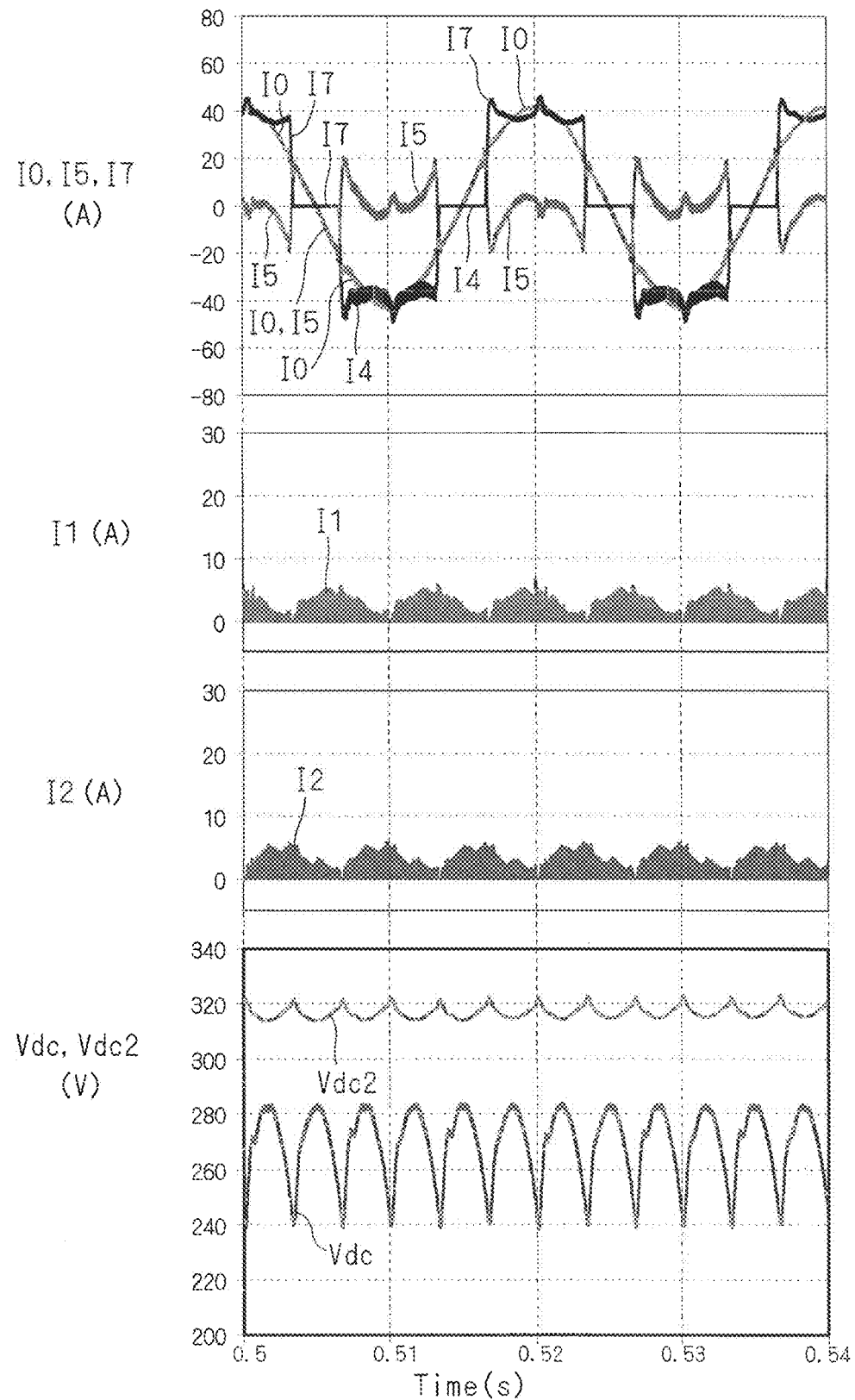
FIGS. 5 and 6 are graphs showing currents and voltages of respective portions in the motor drive system in which the active filter according to the first embodiment is adopted.

FIG. 5 is a graph showing currents and voltages of respective portions in the configuration according to the first embodiment. Here, an electrostatic capacitance of the capacitor C1 is aligned with that in the case shown in FIG. 3.

As seen from a second tier and a third tier, the current I2 is positive, and hence, the current for charging the capacitor C2 becomes larger in the configuration according to the first embodiment than in the comparative example. Accordingly, the voltage Vdc2 becomes significantly higher than the DC voltage Vdc, and the compensation of the harmonic content of the current I7 by the current I5 is also performed sufficiently. In this way, the waveform of the current I0 has turned to a substantial sinusoidal wave shape.

Figure 6:
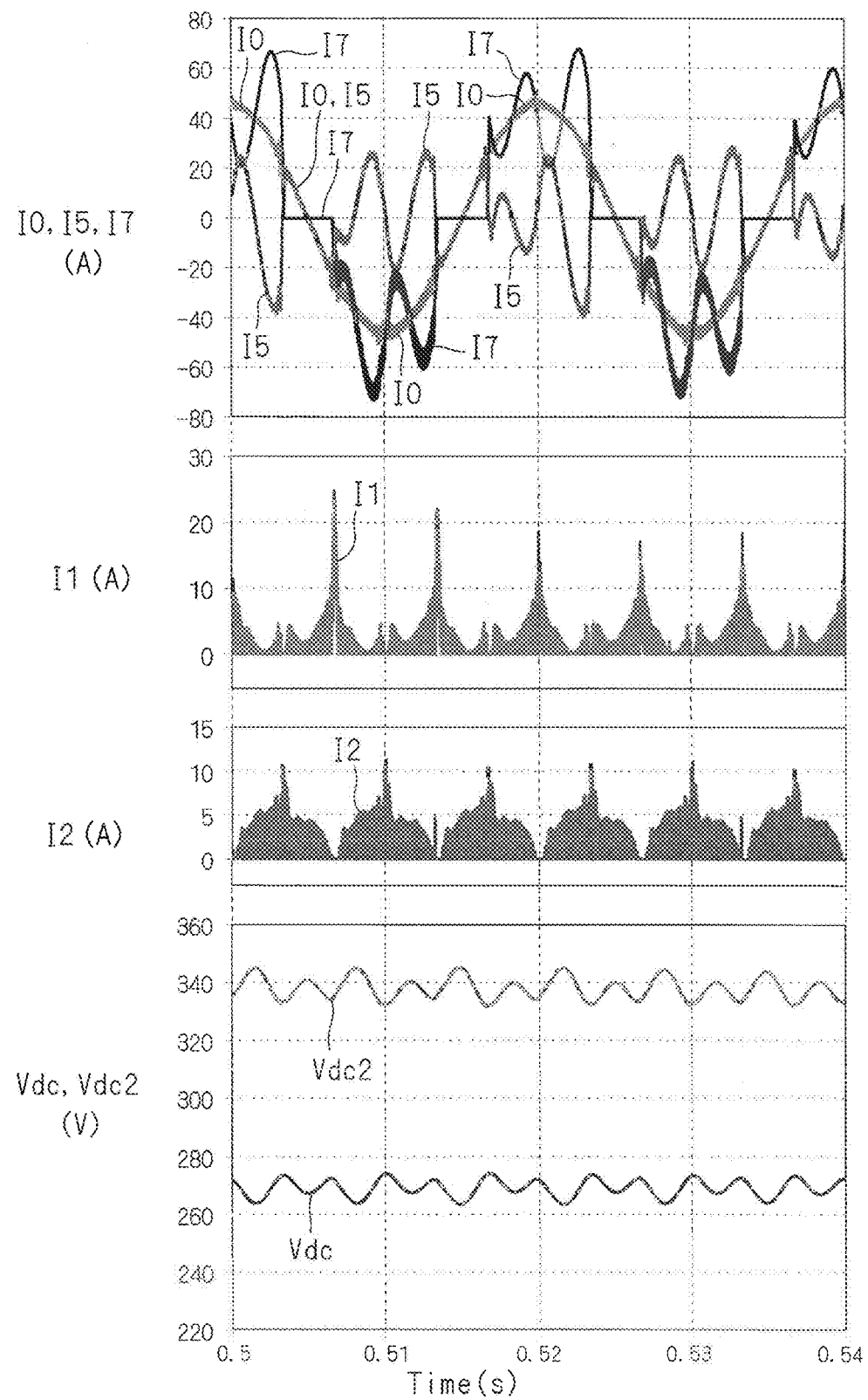

FIG. 6 is a graph showing currents and voltages of the respective portions in the configuration according to the first embodiment. Here, the electrostatic capacitance of the capacitor C1 is aligned with that in the case shown in FIG. 4.

In comparison with the case shown in FIG. 5, in a case shown in FIG. 6, the pulsation of the DC voltage Vdc is suppressed, whereby the voltage Vdc2 is further increased (a peak value of the DC voltage Vdc is approximately 280 V in each of FIG. 5 and FIG. 6; however, the voltage Vdc2 is approximately 340 V in FIG. 6 while the voltage Vdc2 is approximately 320 V in FIG. 5).

The current I7 is more prone to be disturbed when the electrostatic capacitance of the capacitor C1 is larger (FIG. 6); however, the current I5 compensates this disturbance sufficiently, and the waveform of the current I0 has also turned to the substantial sinusoidal wave shape.

From the above, it is seen that the effects by the first embodiment are exerted regardless of a magnitude of the electrostatic capacitance of the capacitor C1. That is to say, for example, an electrolytic capacitor, which is large to an extent capable of smoothing the pulsation of the DC voltage Vdc, can also be connected in parallel to the capacitor C1.

As described above, in accordance with the first embodiment, by such a simple configuration in which the capacitor C2 usually provided in the active filter is connected to the pair of DC buses LH and LL via the pair of diodes D1 and D2, the voltage Vdc2 higher than the DC voltage Vdc is obtained, whereby the harmonic current can be suppressed. This is advantageous in a point that the boost chopper as shown in Japanese Patent No. 4411845 and the transformer as shown in Japanese Patent No. 4284053 are not required.

Second Embodiment

FIG. 7 is a circuit diagram showing a motor drive system in which an active filter according to a second embodiment is adopted. The active filter according to the second embodiment is obtained by replacing the diode D2 by a resistor R2 for the active filter according to the first embodiment (refer to FIG. 1).

That is, though the active filter according to the second embodiment is common to the active filter according to the first embodiment in the point that the above-mentioned pair of current limiting elements are provided, the active filter according to the second embodiment is different from the active filter according to the first embodiment in the point that one in the pair of current limiting elements is the diode D1 and the other thereof is the resistor R2.

The resistor R2 limits the current I2, and reduces the absolute value of the current I2. From another viewpoint, the current I2 generates a voltage drop in the resistor R2. Hence, the voltage Vdc2 can be held to be larger than the DC voltage Vdc.

Figure 8:
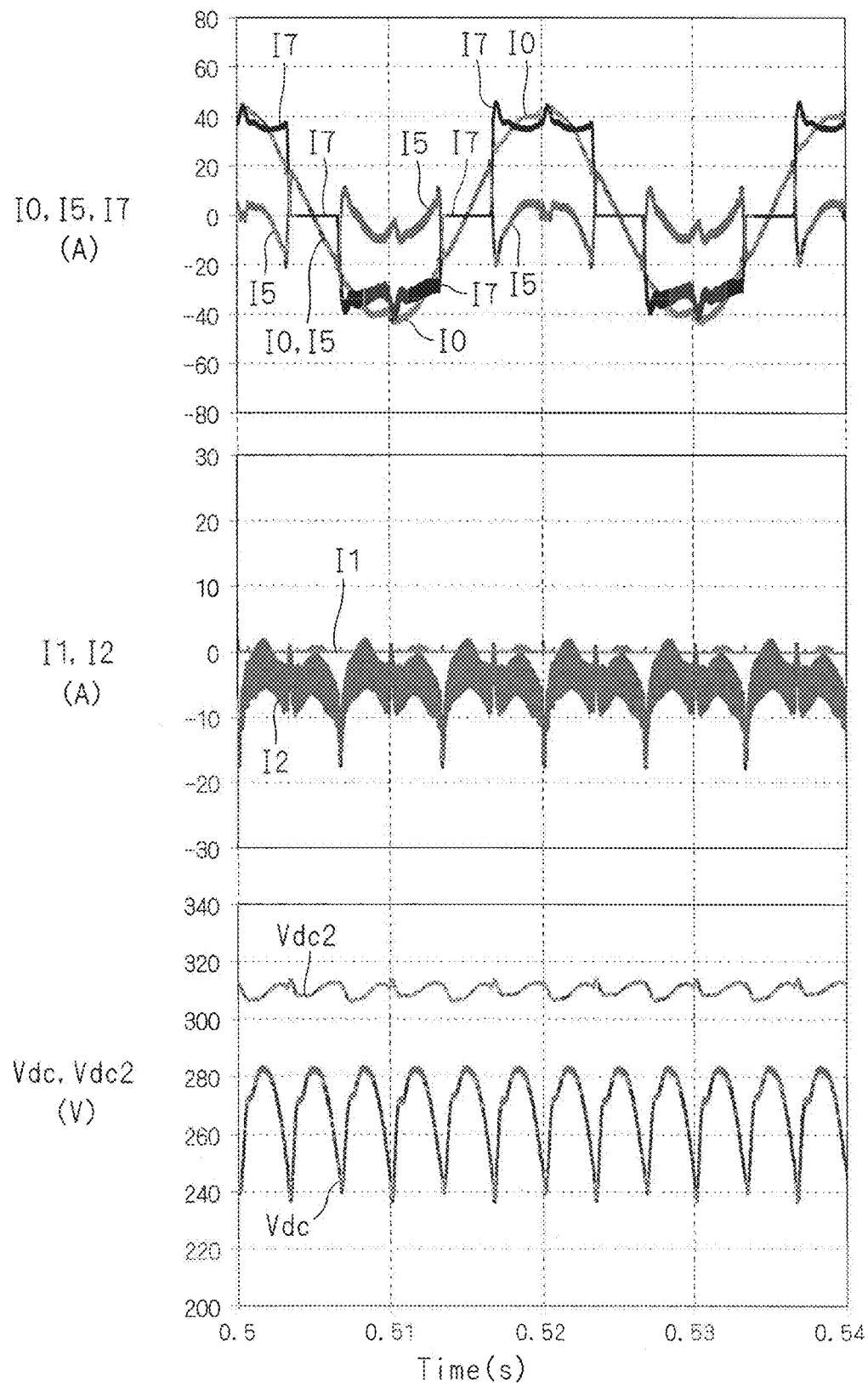

FIG. 8 is a graph showing currents and voltages of respective portions in a configuration according to the second embodiment. Here, the electrostatic capacitance of the capacitor C1 is aligned with that in the case shown in FIG. 3.

Unlike the current I2 of the first embodiment, and similarly to the current I2 of the comparative example, the current I2 of the second embodiment has a period of being negative. However, a maximum value of an absolute value of the current I2 in the second embodiment is a half or less of a maximum value of the absolute value of the current I2 in the comparative example. In this way, also in the second embodiment, approximately 310 V is obtained as the voltage Vdc2.

FIG. 9 is a graph showing currents and voltages of the respective portions in the configuration according to the second embodiment. Here, the electrostatic capacitance of the capacitor C1 is aligned with that in the case shown in FIG. 4.

In comparison with the case shown in FIG. 8, in a case shown in FIG. 9, the pulsation of the DC voltage Vdc is suppressed, whereby the voltage Vdc2 is further increased (the peak value of the DC voltage Vdc is approximately 280 V in each of FIG. 8 and FIG. 9; however, the voltage Vdc2 is approximately 310 to 320 V in FIG. 9 while the voltage Vdc2 is approximately 310 V in FIG. 8).

The current I7 is more prone to be disturbed when the electrostatic capacitance of the capacitor C1 is larger (FIG. 9); however, the current I5 compensates this disturbance sufficiently, and the waveform of the current I0 has also turned to the substantial sinusoidal wave shape.

From the above, it is seen that the effects by the second embodiment are exerted regardless of the magnitude of the electrostatic capacitance of the capacitor C1.

Moreover, in accordance with the second embodiment, by such a simple configuration in which the capacitor C2 usually provided in the active filter is connected to the pair of DC buses LH and LL via the at least one diode D1 and the resistor R2 as the current limiting element, similar effects to the effects by the first embodiment are obtained.

Third Embodiment

FIG. 10 is a circuit diagram showing a motor drive system in which an active filter according to a third embodiment is adopted. The active filter according to the third embodiment is obtained by adding a reactor DCL2 in the low-pass filter 22 for the active filter according to the first embodiment (refer to FIG. 1). Though the low-pass filter 22 is not essential in the first embodiment, the low-pass filter 22 is essential in the third embodiment.

It is understood that the low-pass filter 22 according to the third embodiment includes: the reactor DCL1 provided between the DC bus LH and the diode bridge 21; the reactor DCL2 provided between the DC bus LL and the diode bridge 21; and the capacitor C1 provided between the DC buses LH and LL.

It can also be regarded that, in the low-pass filter 22, the reactors DCL1 and DCL2 are connected in series to each other while sandwiching the capacitor C1 therebetween between a pair of terminals on an output side of the diode bridge 21.

Figure 11:
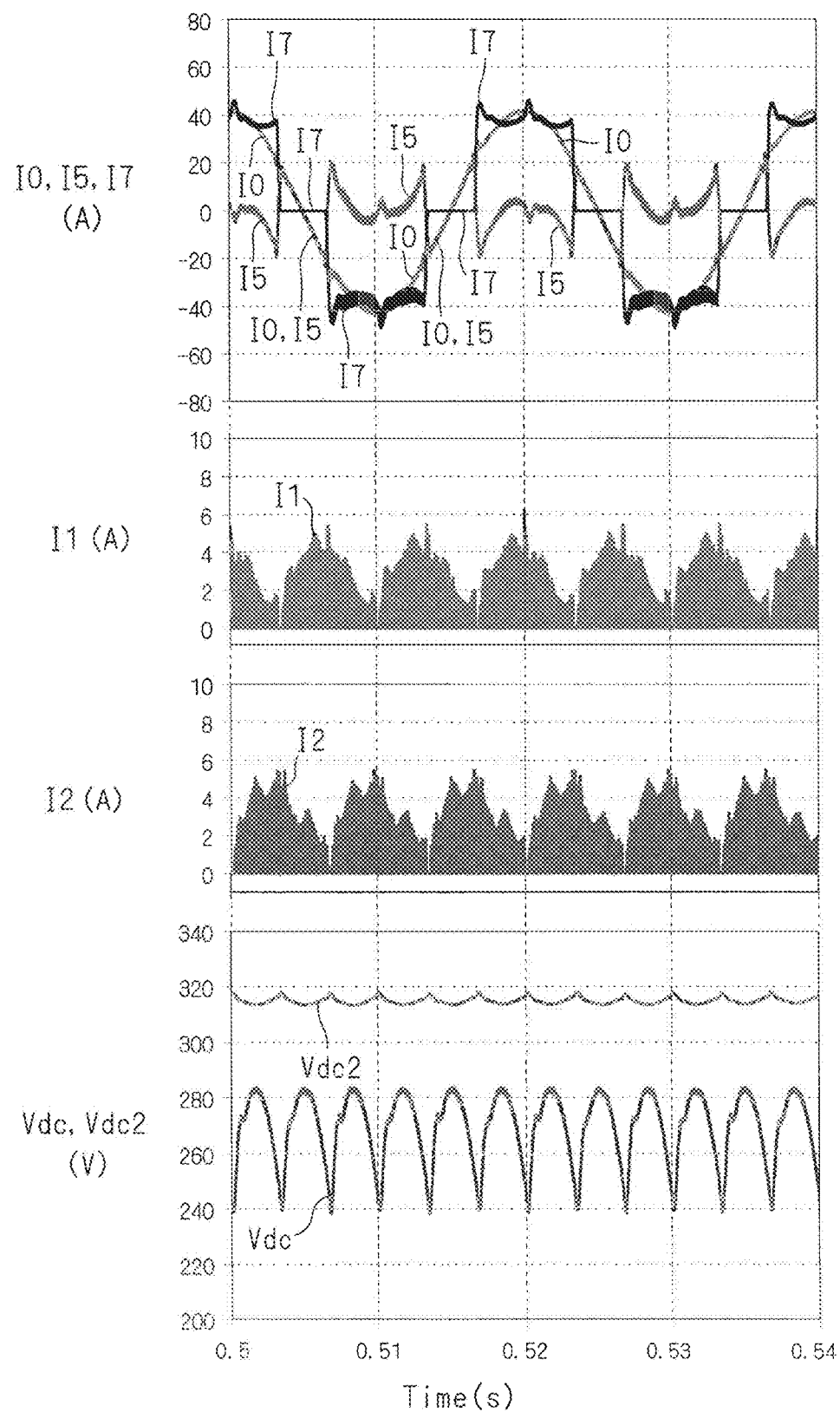
FIGS. 11 and 12 are graphs showing currents and voltages of respective portions in the motor drive system in which the active filter according to the third embodiment is adopted.

FIG. 11 is a graph showing currents and voltages of respective portions in the configuration according to the third embodiment, showing the same contents as those of FIG. 5. However, FIG. 11 is the graph in which axes of ordinates of the currents I1 and I2 shown in FIG. 5 are enlarged and shown. From FIG. 11, it is seen that the waveforms of the currents I1 and I2 are largely different from each other. This is caused by an imbalance between current paths through which the currents I1 and I2 flow. Then, owing to the imbalance concerned, in each of the currents I0, I5 and I7, the waveform is shown to be bold in a section where the current I7 is negative. This fact that the waveform looks bold indicates that, though the low-pass filter 22 is adopted, a carrier signal adopted for controlling the switching of the inverter 5 is superimposed.

Hereinafter, referring to FIG. 10, a description will be made of a state where this imbalance is reduced in the third embodiment.

When Vr<Vs is established, a component in the current I5, which goes from the S-phase to the R-phase, has two paths. A first path is a path that passes, in the following order, through the upper arm-side diode Dsu, which corresponds to the S-phase of the inverter 5, and through the upper arm-side switching element Qru, which corresponds to the R-phases and is conducting. A second path is a path where the current flows as the current I1, and is a path that passes, in the following order, through the upper arm-side diode Rsu, which corresponds to the S-phase of the diode bridge 21, the reactor DCL1, the DC bus LH, the diode D1 and the upper arm-side switching element Qru. Also in the configuration according to the first embodiment, which is shown in FIG. 1, the reactor DCL1 is present in the second path.

When Vr>Vs is established, a component in the current I5, which goes from the R-phase to the S-phase, has two paths. A first path is a path that passes, in the following order, through a lower arm-side switching element Qrd, which corresponds to the R-phase and is conducting, and through a lower arm-side diode Dsd, which corresponds to the S-phase of the inverter 5. A second path is a path where the current flows as the current I2, and is a path that passes through the lower arm-side switching element Qrd, the diode D2, the DC bus LL, and a lower arm-side diode Rsd, which corresponds to the S-phase of the diode bridge 21. Though the reactor DCL2 is not present in the second path in the configuration according to the first embodiment, which is shown in FIG. 1, the reactor DCL2 is present in the second path in the configuration according to the third embodiment, which is shown in FIG. 10.

As described above, in the third embodiment, the reactors DCL1 and DCL2 are present in each of the paths where the currents I1 and I2 flow. In this way, the imbalance between the currents I1 and I2 is alleviated.

Figure 12:
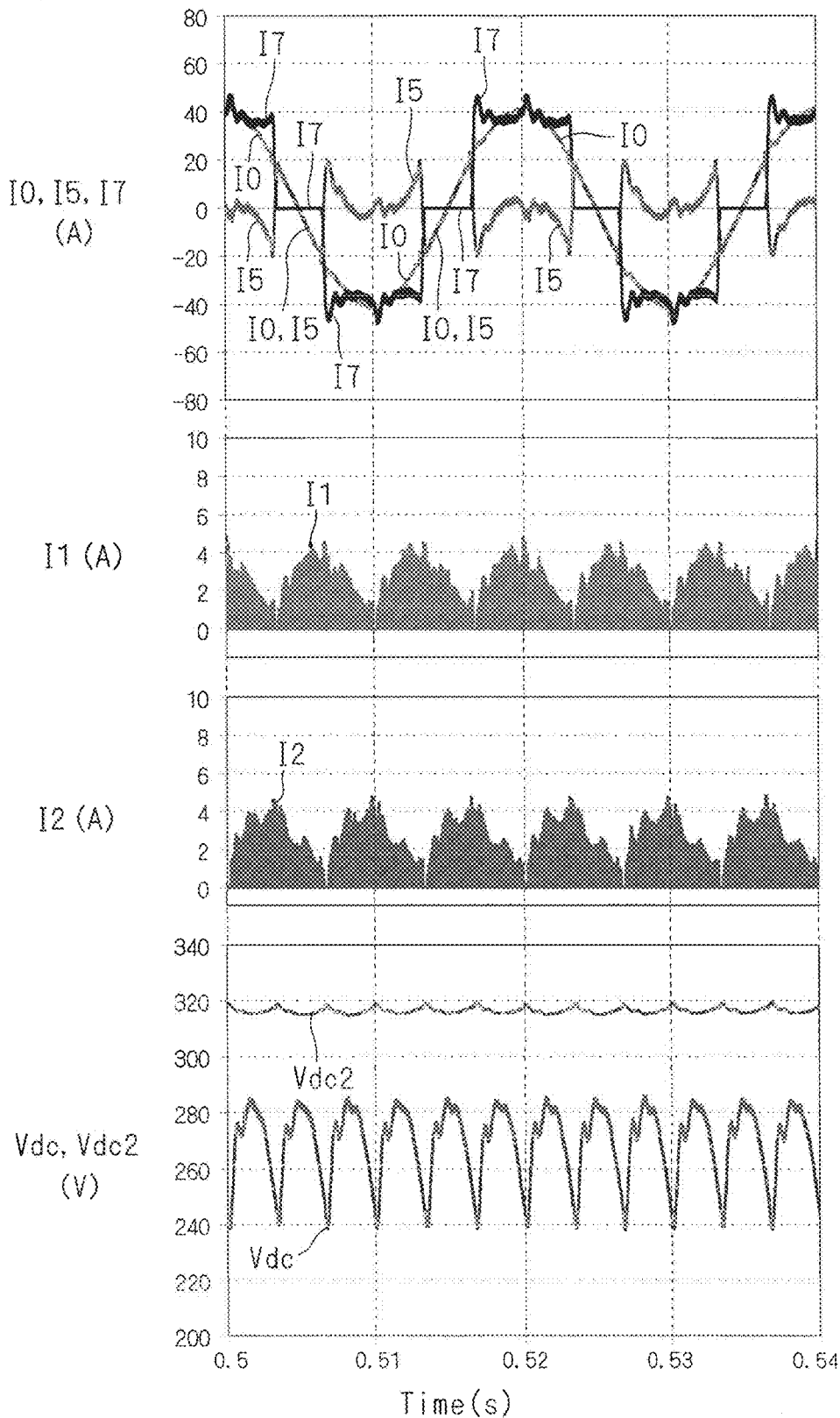

FIG. 12 is a graph showing currents and voltages of respective portions in the configuration according to the third embodiment, showing a content corresponding to FIG. 11. In comparison with the case shown in FIG. 11, in a case shown in FIG. 12, it is seen that the waveforms of the currents I1 and I2 are similar to each other, and that the superimposition of the carrier signal in the waveforms of the currents I0, I5 and I7 is reduced.

As described above, in the third embodiment, in the configuration of the low-pass filter 22, the capacitor C1 is sandwiched between the pair of reactors DCL1 and DCL2, and further, these three components are connected in series to one another on the output side of the diode bridge 21. In this way, the imbalance between the currents I1 and I2 is alleviated, whereby a carrier component for use in controlling the inverter 5 is reduced in the current I0.

First Modification Example

FIG. 13 is a circuit diagram showing a motor drive system in which an active filter according to a first modification example is adopted. In the configuration shown in the first embodiment (refer to FIG. 1), a configuration in which the diode D1 is replaced by the resistor R1 is provided. In a similar way to the configuration shown in the second embodiment (refer to FIG. 7), such a configuration causes the resistor R1 to function as a current limiting element, and can obtain similar effects.

Second Modification Example

FIG. 14 is a circuit diagram showing a motor drive system in which an active filter according to a second modification example is adopted. In the configuration shown in the third embodiment (refer to FIG. 10), a configuration in which the diode D2 is replaced by the resistor R2 is provided. In accordance with such a configuration, similar effects to those of the third embodiment can be obtained in consideration of the content described in the second embodiment. However, the current I1 flows through the diode D1, and the current I2 flows through the resistor R2, and accordingly, the effect of absorbing the imbalance between the currents I1 and I2 is expected more in the third embodiment.

As described above, the first embodiment, the second embodiment, the third embodiment and the modifications thereof can be combined with one another to create modifications as long as each thereof does not break the functions and effects of the others thereof.

Fourth Embodiment

FIG. 15 is a circuit diagram partially showing a configuration of an active filter according to a fourth embodiment. The active filter according to the fourth embodiment is obtained by adding a clamp circuit 8 to the active filter according to the first embodiment (refer to FIG. 1).

In a case of reducing the electrostatic capacitances of the capacitors C1 and C2, it is particularly suitable to provide the clamp circuit 8 as described above. In a case where the electrostatic capacitance of the capacitor C1 is reduced, and a so-called electrolytic capacitor-less inverter (for example, refer to Japanese Patent Application Laid-Open No. 2002-51589 and Japanese Patent Application Laid-Open No. 2015-092813) is adopted, the electrostatic capacitance of the capacitor C2 can also be reduced. When the electrostatic capacitances of the capacitors C1 and C2 are low, an influence given to the DC voltage Vdc and the voltage Vdc2 (refer to the first embodiment) by surge currents outputted from the rectifier circuit 2 and the inverter 5 is large. Accordingly, such an influence is reduced by providing the clamp circuit 8.

In other words, the clamp circuit 8 is provided, whereby, even if the electrostatic capacitances of the capacitors C1 and C2 are low, fluctuations of the DC voltage Vdc and the voltage Vdc2, which are the respective voltages thereof, are suppressed.

Specifically, in the fourth embodiment, the clamp circuit 8 includes a clamping diode D3 and a clamping capacitor C3. The clamping diode D3 is provided between the capacitor C2 and the diode D1 as the current limiting element, and is reverse to the DC voltage Vdc. More specifically, with regard to the clamping diode D3, an anode thereof is connected to the capacitor C2, and a cathode thereof is connected to a cathode of the diode D1.

The diodes D1 and D2 as the pair of current limiting elements are connected in series to the clamping capacitor C3 between the DC buses LH and LL. The diode D1 is connected to one end of the capacitor C1 via the clamping diode D3. Hence, specifically, the clamping capacitor C3 is connected between the cathode of the diode D1 and the anode of the diode D2. From another viewpoint, the clamping capacitor C3 is connected in parallel to the capacitor C2 via the clamping diode D3 more on the capacitor C2 side than the diode D1.

Figure 16:
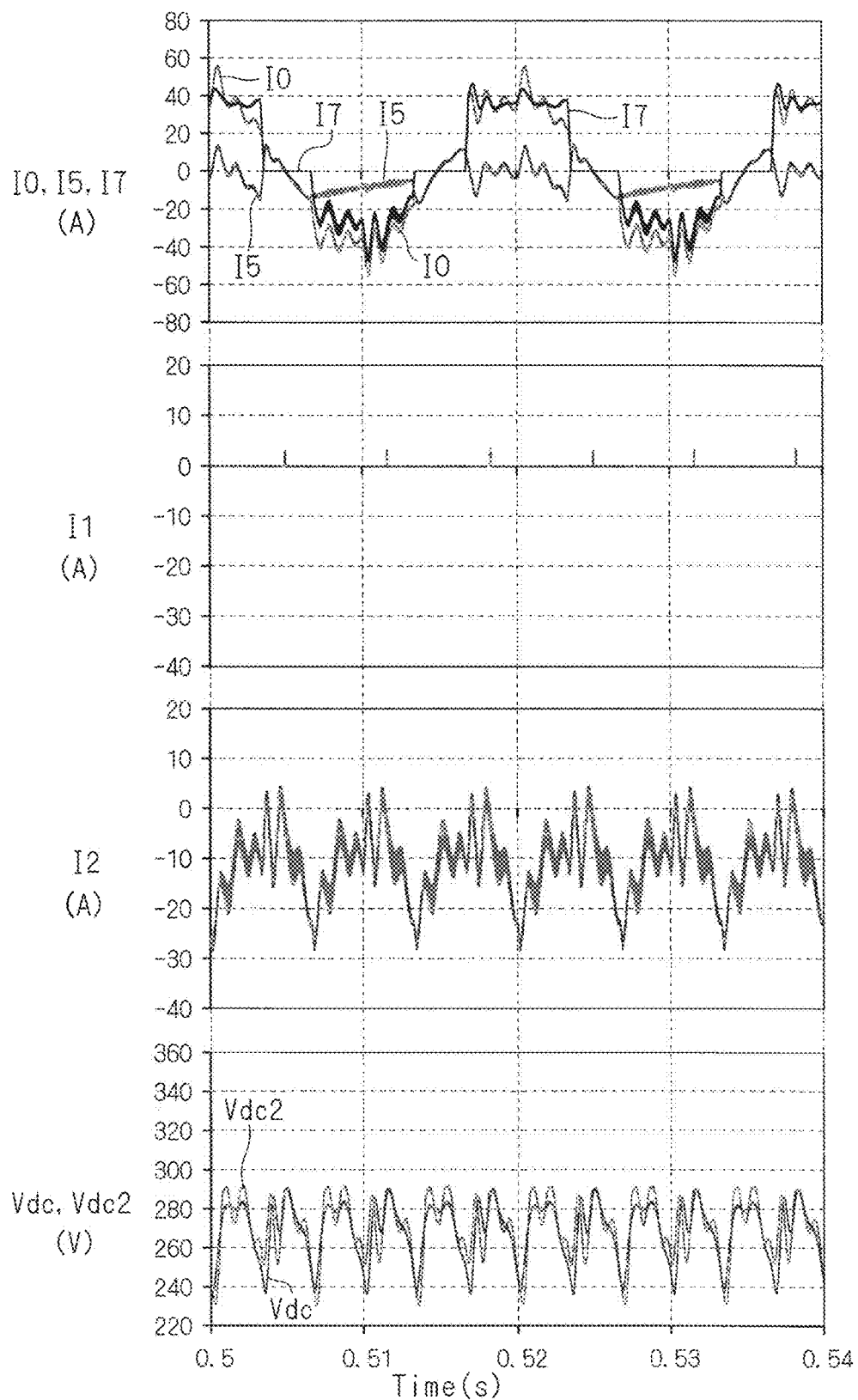
FIG. 16 is a graph showing currents and voltages of respective portions in a motor drive system in which an active filter serving as a comparative example with the fourth embodiment is adopted.

FIG. 16 is a graph showing currents and voltages of respective portions in a motor drive system in which an active filter serving as a comparative example with the fourth embodiment is adopted. Specifically, the comparative example has a configuration in which the diode D2 shown in FIG. 15 is short-circuited and removed. That is, a relationship of the comparative example with the fourth embodiment is the same as a relationship of the comparative example (in the first embodiment) with the first embodiment.

Figure 17:
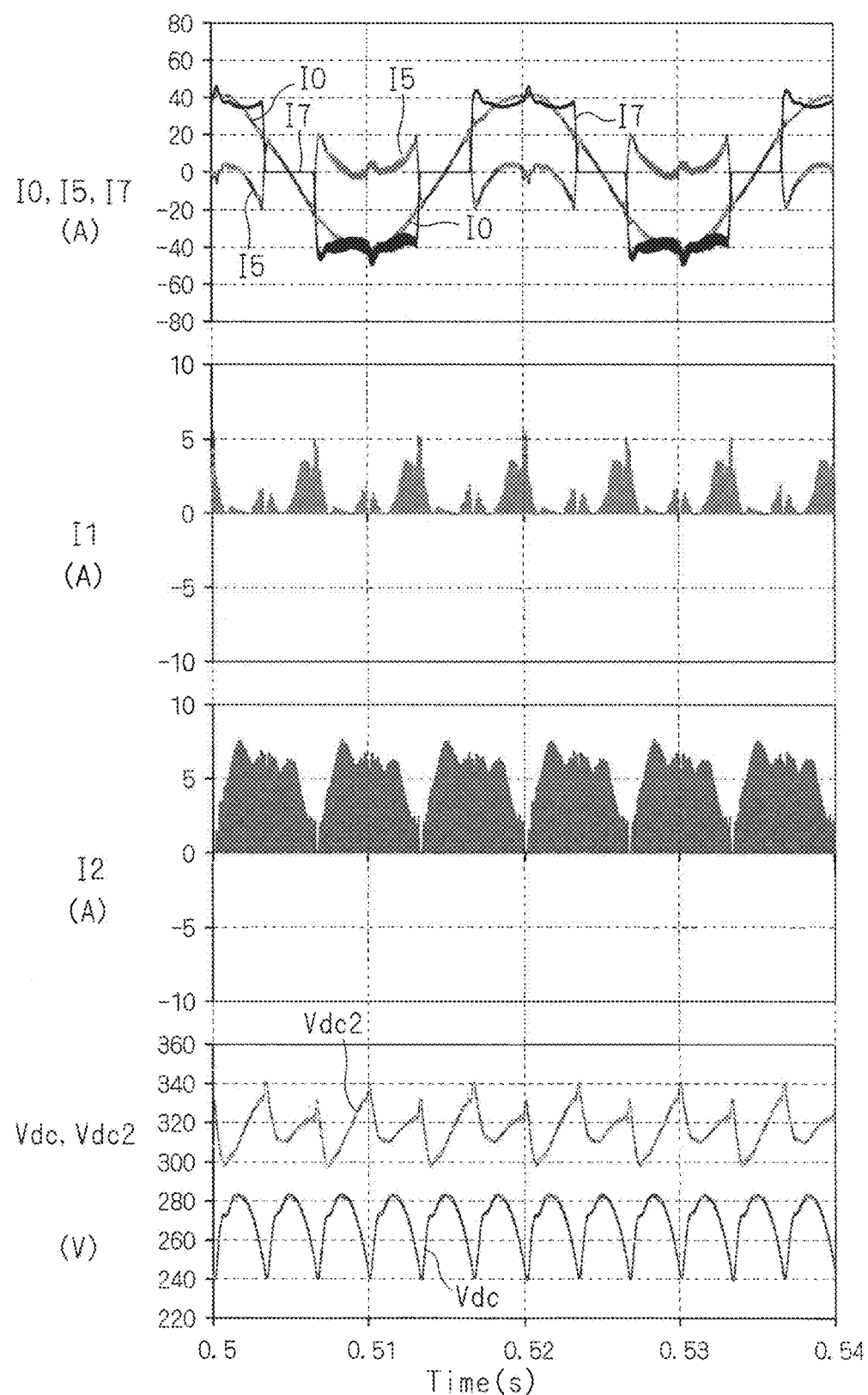
FIG. 17 is a graph showing currents and voltages of respective portions in the motor drive system in which the active filter according to the fourth embodiment is adopted.

FIG. 17 is a graph showing currents and voltages of the respective portions in the motor drive system in which the active filter according to the fourth embodiment is adopted. In FIG. 16 and FIG. 17, currents I0, I5 and I7 are those described in the first embodiment, and are illustrated in FIG. 1.

As obvious from comparison between FIG. 16 and FIG. 17, in such a case where the active filter according to the fourth embodiment is adopted, the difference between the voltage Vdc2 and the DC voltage Vdc is larger and the current I0 is more approximate to the sinusoidal wave than in the case where the active filter as the comparative example is adopted.

That is, also in the configuration in which the clamp circuit 8 is provided, in a similar way to the first embodiment, by such a simple configuration in which the capacitor C2 is connected to the pair of DC buses LH and LL via the pair of diodes D1 and D2, the voltage Vdc2 higher than the DC voltage Vdc is obtained, whereby the harmonic current can be suppressed.

Figure 18:
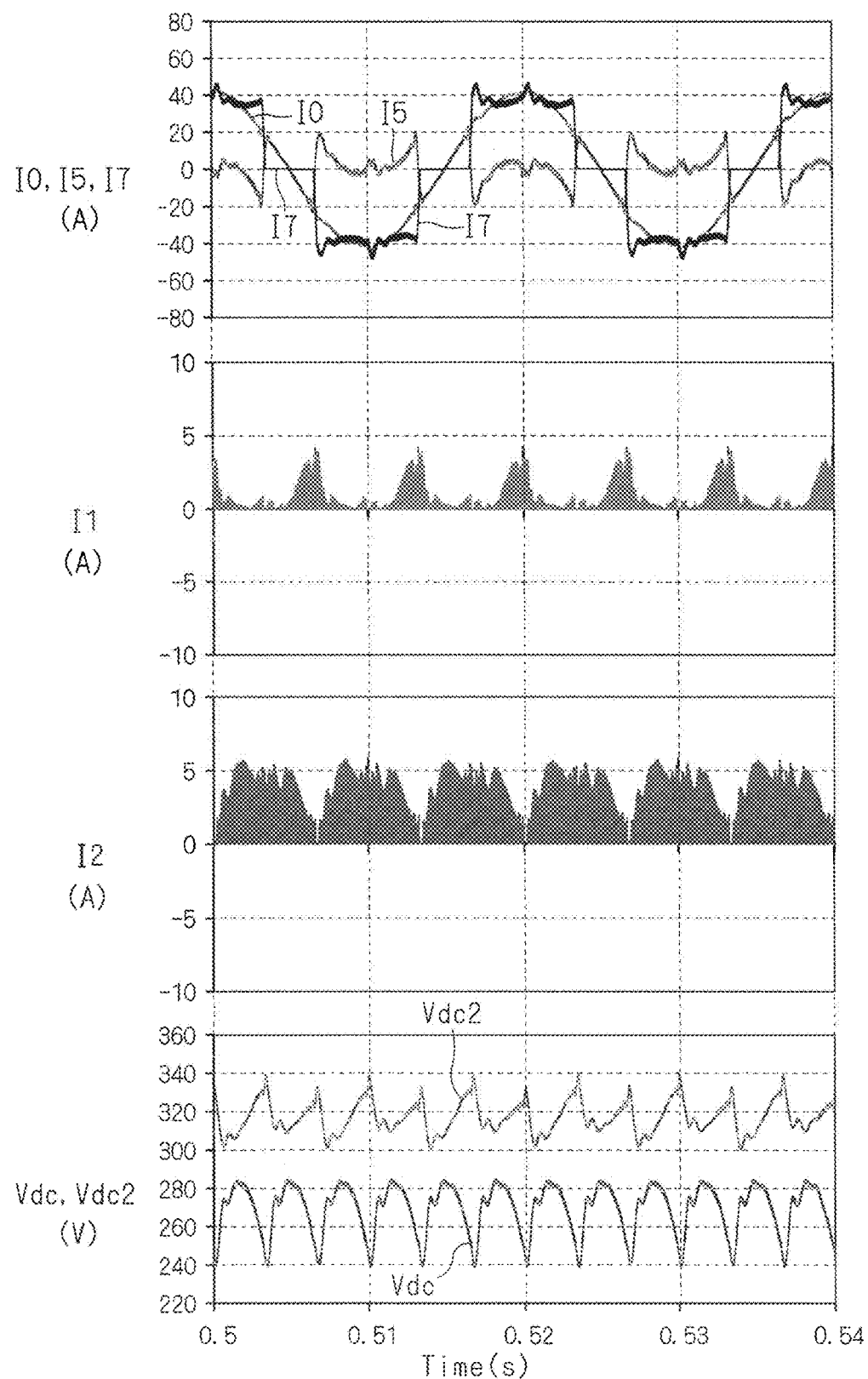
FIG. 18 is a graph showing currents and voltages of respective portions in a motor drive system in which an active filter serving as a third modification example is adopted.

FIG. 18 is a graph showing currents and voltages of respective portions in a motor drive system in which an active filter of a third modification example as a modification of the fourth embodiment is adopted. For the fourth embodiment, the third modification example adopts, as the low-pass filter 22, a configuration adopted in the third embodiment, that is, a configuration in which the reactors DCL1 and DCL2 are connected in series to each other while sandwiching the capacitor C1 therebetween between the pair of output-side terminals of the diode bridge 21.

That is, a relationship of the third modification example with the fourth embodiment is the same as a relationship of the third embodiment with the first embodiment.

The waveforms of the currents I0, I5 and I7 shown in FIG. 17 are shown to be bold in the section where the current I7 is negative. This fact that the waveforms look bold indicates that, as described in the third embodiment, though the low-pass filter 22 is adopted in the first embodiment, such a carrier signal adopted for controlling the switching of the inverter 5 is superimposed. This is caused by the imbalance between the current paths through which the currents I1 and I2 flow.

Hence, in a similar way to the third embodiment, the reactors DCL1 and DCL2 are adopted, whereby the balance in each thereof is also reflected on the waveforms of the currents I0, I5 and I7 as shown in FIG. 18.

Hence, in a similar way to the third embodiment, also in the third modification example, the imbalance between the currents I1 and I2 is alleviated, whereby the carrier component for use in controlling the inverter 5 is reduced in the current I0.

FIG. 19 is a circuit diagram partially showing a configuration of an active filter of a fourth modification example as a modification of the fourth embodiment. For the fourth embodiment, the fourth modification example adopts a resistor R2 in place of the diode D2 as the current limiting element. That is, a relationship of the fourth modification example with the fourth embodiment is the same as a relationship of the second embodiment with the first embodiment.

Figure 20:
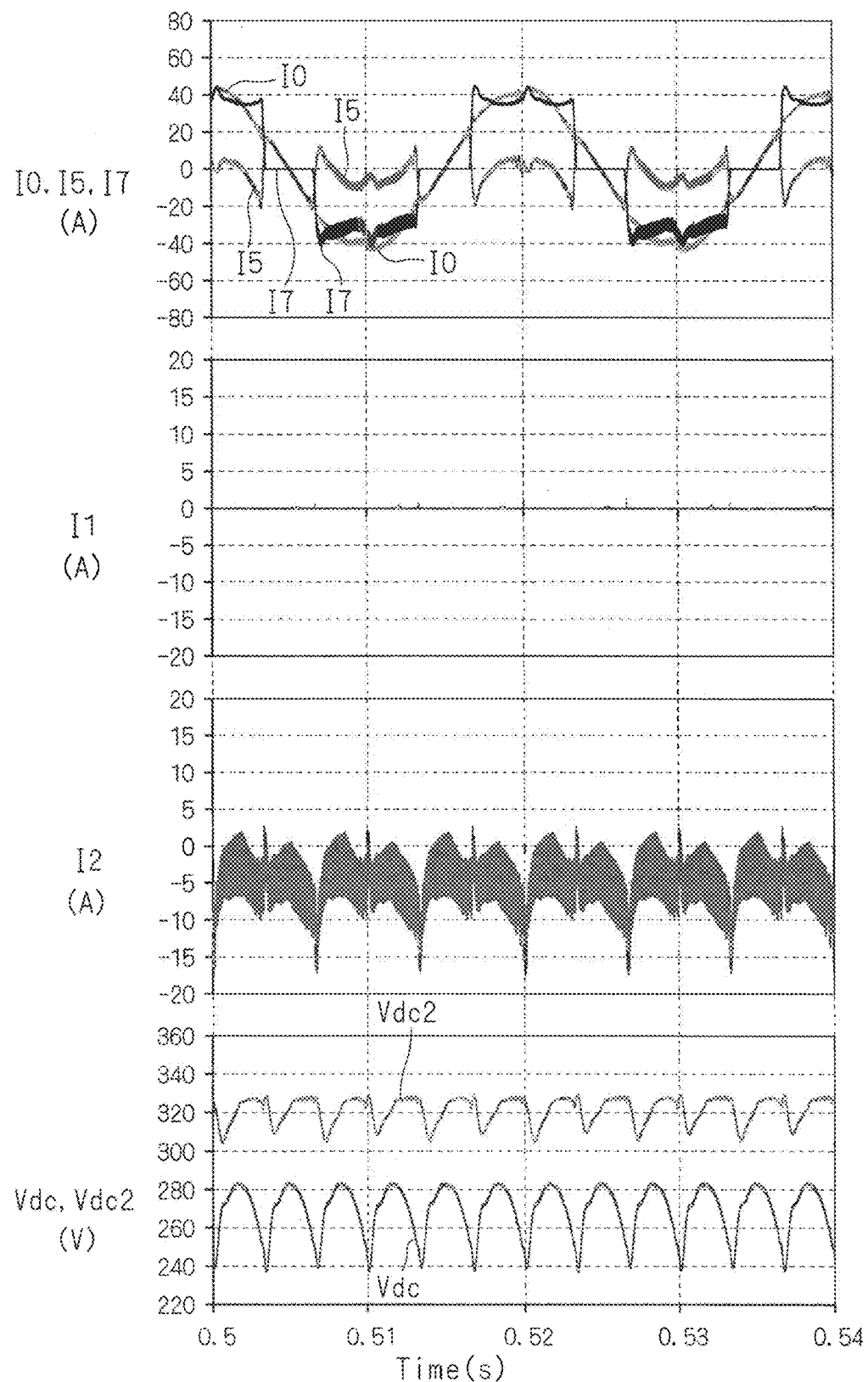
FIG. 20 is a graph showing currents and voltages of respective portions in a motor drive system in which the active filter serving as the fourth modification example is adopted.

FIG. 20 is a graph showing currents and voltages of respective portions in a motor drive system in which the active filter serving as the fourth modification example is adopted. In a similar way to the second embodiment, in the current I2, a lot of periods while the current I2 is negative are present; however, the voltage Vdc2 is obviously higher than the DC voltage Vdc. In this way, similar effects to those of the second embodiment are also obtained in the fourth modification example.

Fifth Embodiment

Figure 21:
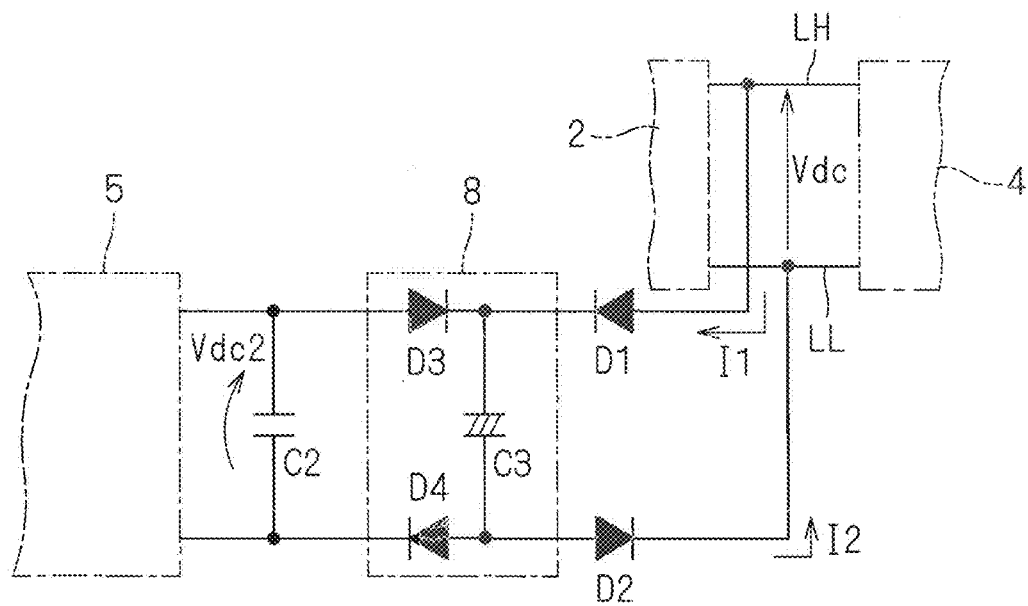
FIG. 21 is a circuit diagram partially showing a configuration of an active filter according to a fifth embodiment.

FIG. 21 is a circuit diagram partially showing a configuration of an active filter according to a fifth embodiment. A clamp circuit 8 in the fifth embodiment has a configuration in which a clamping diode D4 is added to the clamp circuit 8 shown in the fourth embodiment.

Specifically, the clamping diode D4 is connected in series to the clamping diode D3 and the clamping capacitor C3 between the pair of ends of the capacitor C2. The clamping diode D4 is reverse to the DC voltage Vdc. More specifically, with regard to the clamping diode D4, an anode thereof is connected to the anode of the diode D2, and a cathode thereof is connected to the capacitor C2.

When the DC buses LH and LL side are viewed from the inverter 5, the clamping diode D4 and the diode D2 are connected in series to each other, and are disposed so that forward directions thereof are reverse to each other. Hence, currents, which flow through the diodes D1 and D2 and the clamping diodes D3 and D4, charge the clamping capacitor C3 inevitably. Hence, a current capacity required for the clamping diode D3 can be reduced by providing the clamping diode D4. In addition, it is sufficient that a current capacity required for the clamping diode D4 is substantially equal to the current capacity required for the clamping diode D3. Hence, moreover, current capacities required for the diodes D1 and D2 can also be reduced.

Figure 22:
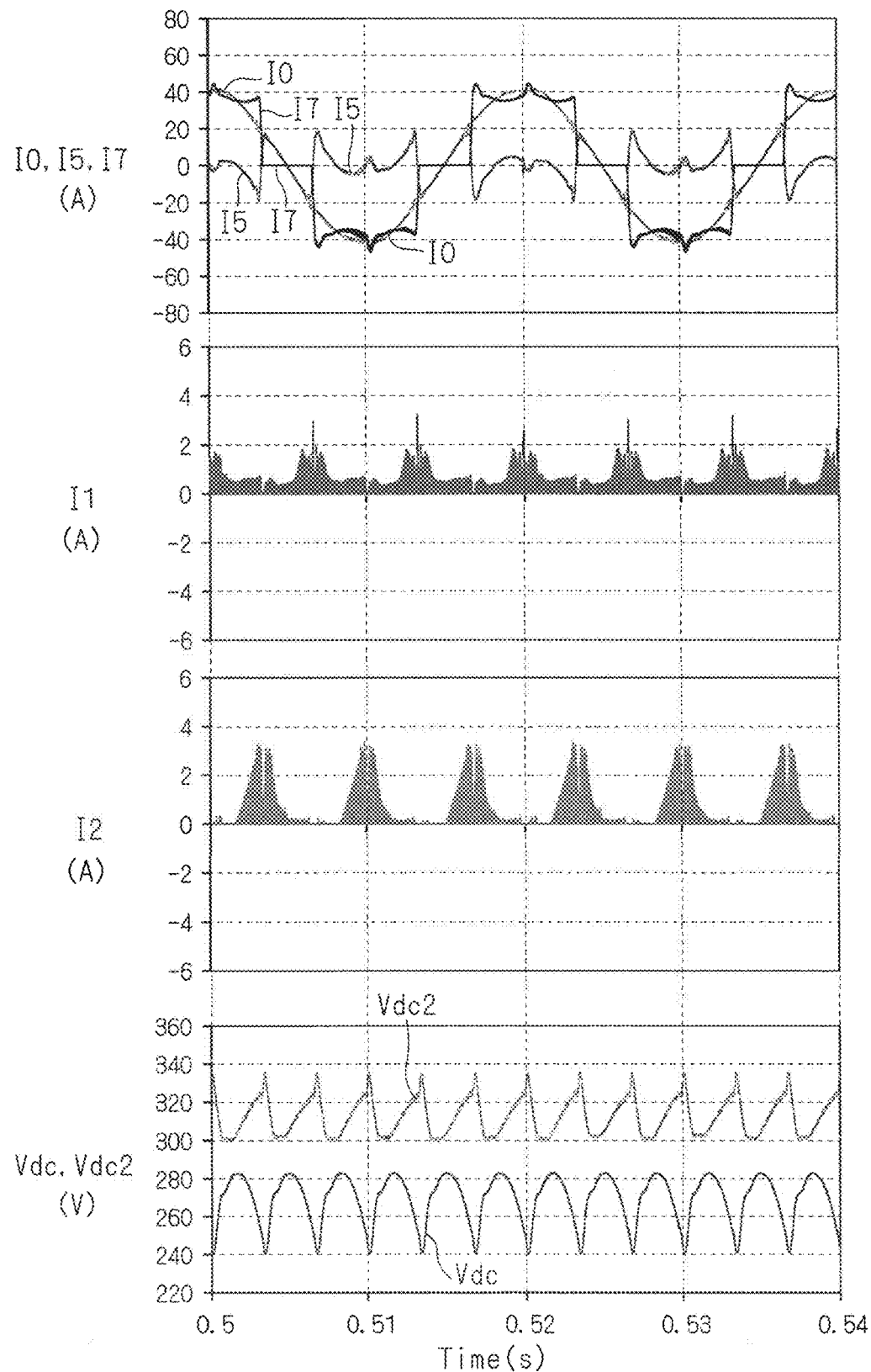
FIG. 22 is a graph showing currents and voltages of respective portions in a motor drive system in which the active filter according to the fifth embodiment is adopted.

FIG. 22 is a graph showing currents and voltages of respective portions in the motor drive system in which the active filter according to the fifth embodiment is adopted. Currents I1 and I2 in the fifth embodiment are smaller than the currents I1 and I2 in the fourth embodiment (refer to FIG. 17). This serves as a base of the reduction of the current capacities required for the diodes D1 and D2 and the clamping diodes D3 and D4, which are mentioned above.

In addition, in this embodiment, the balance between the currents I1 and I2 is improved, and accordingly, the carrier components in the currents I0, I5 and I7 are reduced in comparison with those of the fourth embodiment.

FIG. 23 is a circuit diagram partially showing a configuration of an active filter serving as a fifth modification example. For the fifth embodiment, the fifth modification example adopts the resistor R2 in place of the diode D2 as the current limiting element. That is, a relationship of the fifth modification example with the fifth embodiment is the same as the relationship of the second embodiment with the first embodiment.

Figure 24:
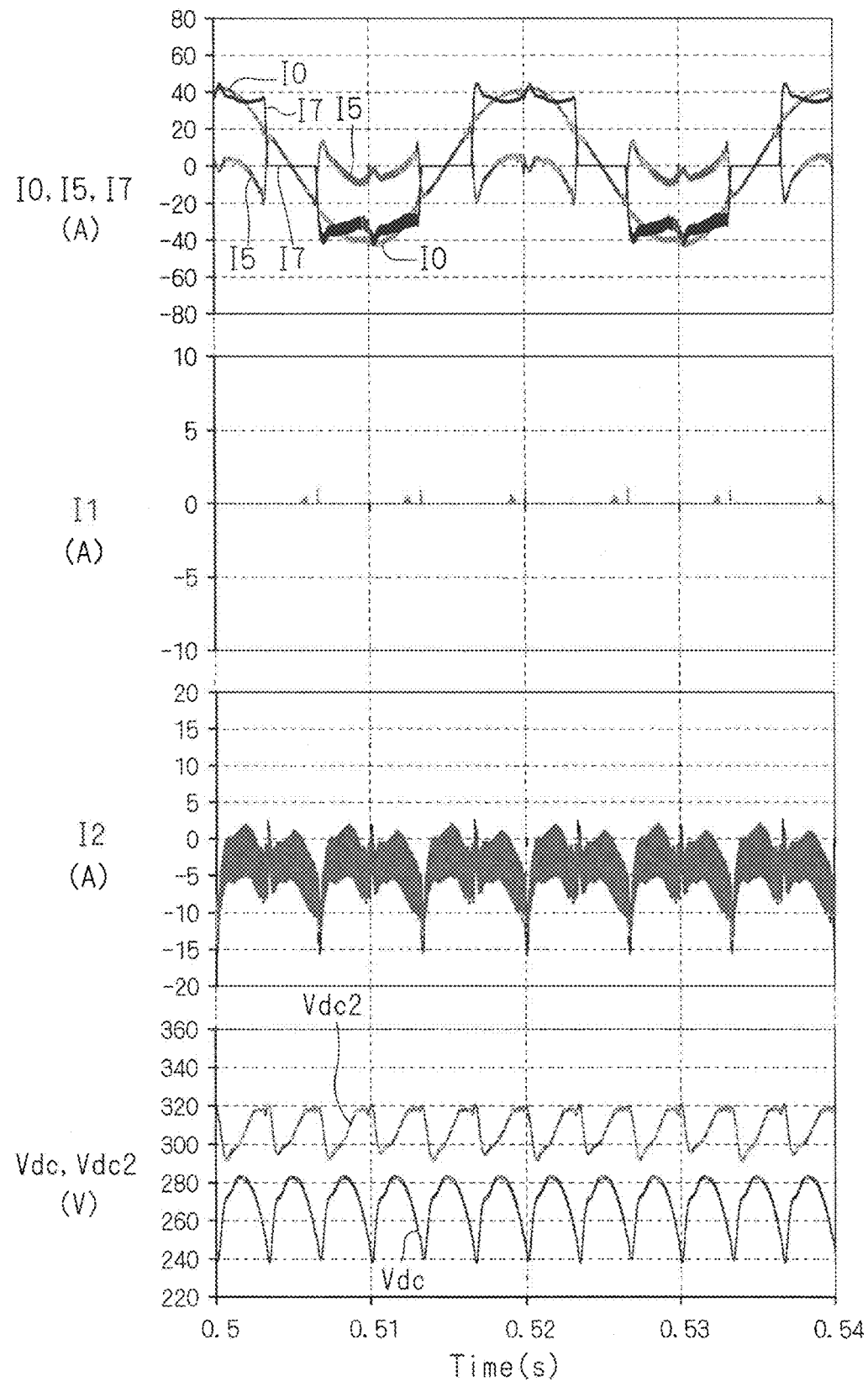
FIG. 24 is a graph showing currents and voltages of respective portions in a motor drive system in which the active filter serving as the fifth modification example is adopted.

FIG. 24 is a graph showing currents and voltages of respective portions in a motor drive system in which the active filter serving as the fifth modification example is adopted. In a similar way to the second embodiment, in the current I2, a lot of periods while the current I2 is negative are present; however, the voltage Vdc2 is obviously higher than the DC voltage Vdc. In this way, similar effects to those of the second embodiment are also obtained in the fifth modification example.

Note that, in the fifth modification example, the carrier component cannot be blocked as much as a reverse current of the diode D2 does. Hence, an improvement factor for the waveform in the current I0 is substantially equal to that in the case where the clamping diode D4 is not present (fourth modification example: refer to FIG. 20). In other words, in a case where not the diode D2 but the resistor R2 is adopted as the current limiting element, it can be said that whether or not the clamping diode D4 is present does not give much influence to the effects.

Figure 25:
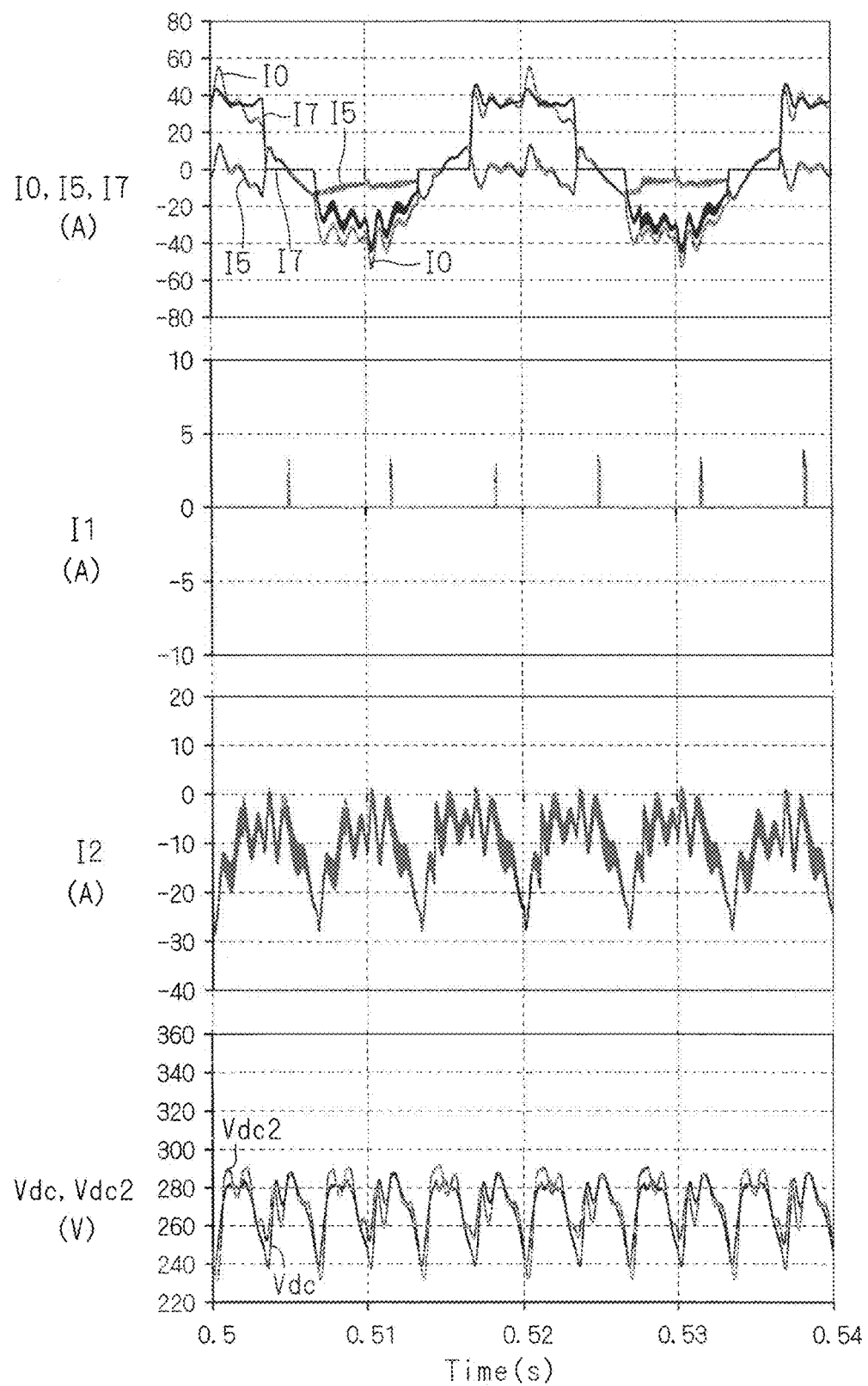
FIG. 25 is a graph showing currents and voltages of respective portions in a motor drive system in which an active filter serving as a comparative example with the fifth embodiment is adopted.

FIG. 25 is a graph showing currents and voltages of respective portions in a motor drive system in which an active filter serving as a comparative example with the fifth embodiment is adopted. Specifically, the comparative example has a configuration in which the diode D2 shown in FIG. 21 is short-circuited and removed. That is, a relationship of the comparative example with the fifth embodiment is the same as a relationship of the comparative example (in the first embodiment) with the first embodiment.

As comparison of FIG. 22 and FIG. 24 with FIG. 25, there can be seen a function to improve the waveforms of the currents I0, I5 and I7, the function being performed by the diode D2 or the resistor R2, which is the current limiting element.

Sixth Embodiment

FIG. 26 is a circuit diagram partially showing a configuration of an active filter according to a sixth embodiment. However, in order to be used for the description of the sixth embodiment, there are further introduced: a voltage Vdb outputted by the diode bridge 21; a current I8 flowing through the clamping capacitor C3, currents I3 and I4 flowing (as forward currents) through the clamping diodes D3 and D4, respectively; and a voltage VC3 applied to the clamping capacitor C3. Here, the voltage Vdb takes the DC bus LL as a reference, the current I8 takes, as a positive direction, a direction that goes from the diode D1 and the clamping diode D3 toward the diode D2 and the clamping diode D4, and the voltage VC3 takes a point connecting the diode D2 with the clamping diode D4 as a reference.

FIG. 27 is a circuit diagram showing an equivalent circuit in the motor drive system in which the active filter according to the sixth embodiment is adopted. However, the equivalent circuit is shown while paying attention to a common mode voltage.

Specifically, the diode bridge 21 generates a common mode voltage Vdbc of the voltage Vdb, and the inverter 5 generates a common mode voltage Vfc of the voltage Vdc2. The references of the voltages Vdb and VC3 are adopted as mentioned above, whereby directions shown by arrows in FIG. 27 become directions of positive voltages.

Referring to FIG. 1, the voltages Vr, Vs and Vt obtained from the AC power supply 1 form the three-phase AC voltage, and accordingly, the common mode voltage Vdbc is obtained by Equation (1).

$$Vdbc=(Vr+Vs+Vt)/3 \qquad (1)$$

Moreover, when voltages Vu, Vv and Vw of the respective AC-side terminals 51, 52 and 53, which take the DC-side terminal 55 as a reference, are introduced, the common mode voltage Vfc is obtained by Equation (2).

$$Vfc=(Vu+Vv+Vw)/3 \qquad (2)$$

Figure 28:
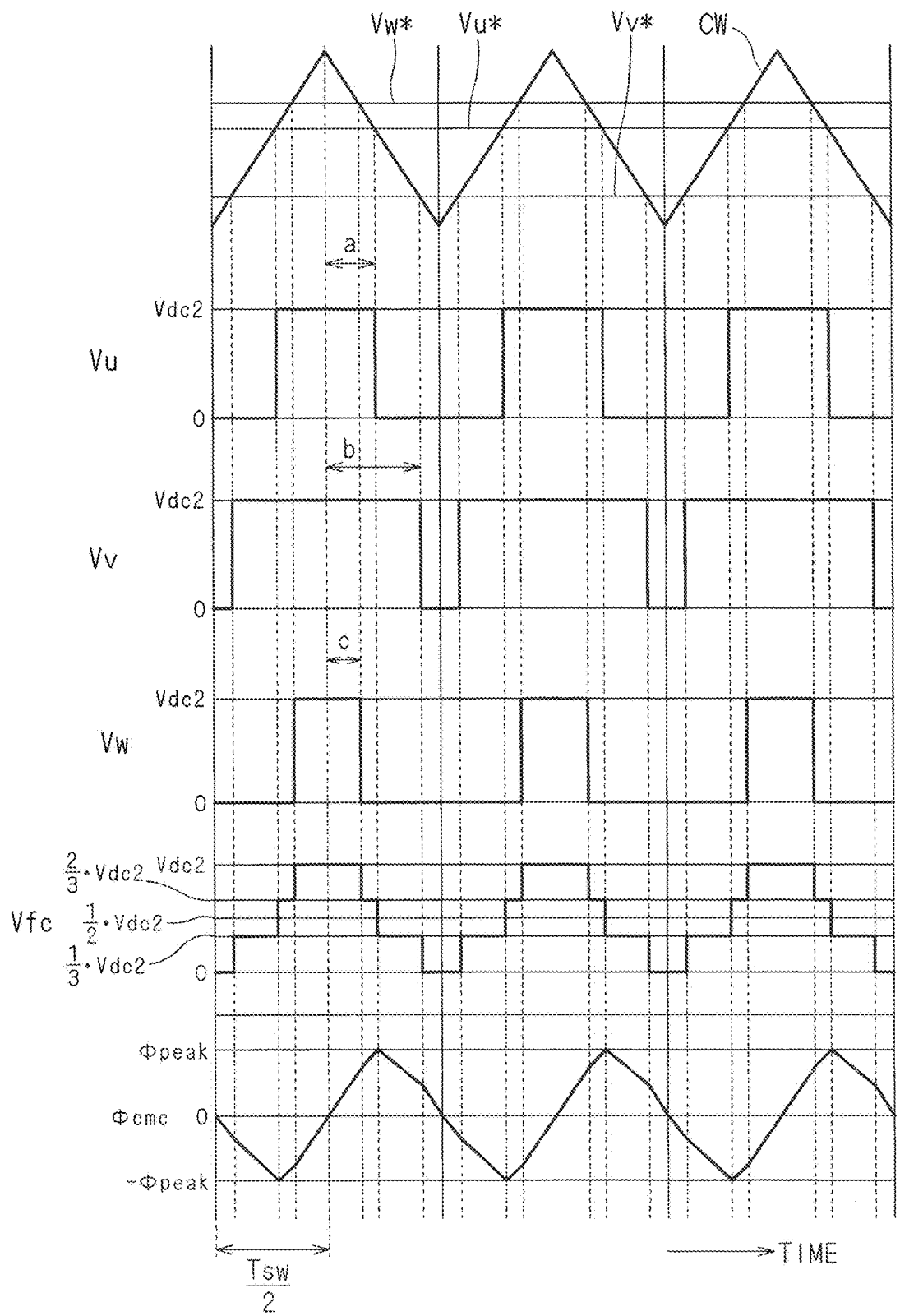
FIG. 28 is a graph explaining a common mode voltage in the sixth embodiment.

FIG. 28 is a graph explaining the common mode voltage Vfc. A switching operation of the inverter 5 is decided by comparison between a carrier CW and signal waves Vu*, Vv* and Vw*. The signal waves Vu*, Vv* and Vw* correspond to command values of the voltages Vu, Vv and Vw. A brief description is made. In a case where the carrier CW takes a value equal to or larger than the signal wave Vu*, the voltage Vu coincides with the voltage Vdc2, and otherwise, the voltage Vu becomes 0. A similar manner also applies to the voltages Vv and Vw. Such a technology as described above is well-known to those skilled in the art, and accordingly, a detailed description thereof is omitted.

The voltages Vu, Vv and Vw are decided as described above, and accordingly, the common mode voltage Vfc exhibits a step-like waveform taking four types of values, which are 0 time, ⅓ time, ⅔ time and 1 time the voltage Vdc2. A fundamental frequency of the waveform coincides with a frequency of the carrier CW.

Here, the signal waves Vu*, Vv* and Vw* are represented by Equation (3). Here, a modulation factor K and a phase α for a cycle of the signal waves Vu*, Vv* and Vw* are introduced.

$$Vu=K\cdot\sin(\alpha),\ Vv=K\cdot\sin(\alpha-2\pi/3),\ Vw=K\cdot\sin(\alpha+2\pi/3) \quad (3)$$

In this way, a half value a of a time while the voltage Vu takes the voltage Vdc2, a half value b of a time while the voltage Vv takes the voltage Vdc2 and a half value c of a time while the voltage Vw takes the voltage Vdc2 are represented by Equation (4). Here, a cycle Tsw of the carrier CW is introduced.

$$a=(Tsw/2)/(\tfrac{1}{2}-K\cdot\sin(\alpha)),\ b=(Tsw/2)/(\tfrac{1}{2}-K\cdot\sin(\alpha-2\pi/3)),\ c=(Tsw/2)/(\tfrac{1}{2}-K\cdot\sin(\alpha+2\pi/3)) \quad (4)$$

Figure 29:
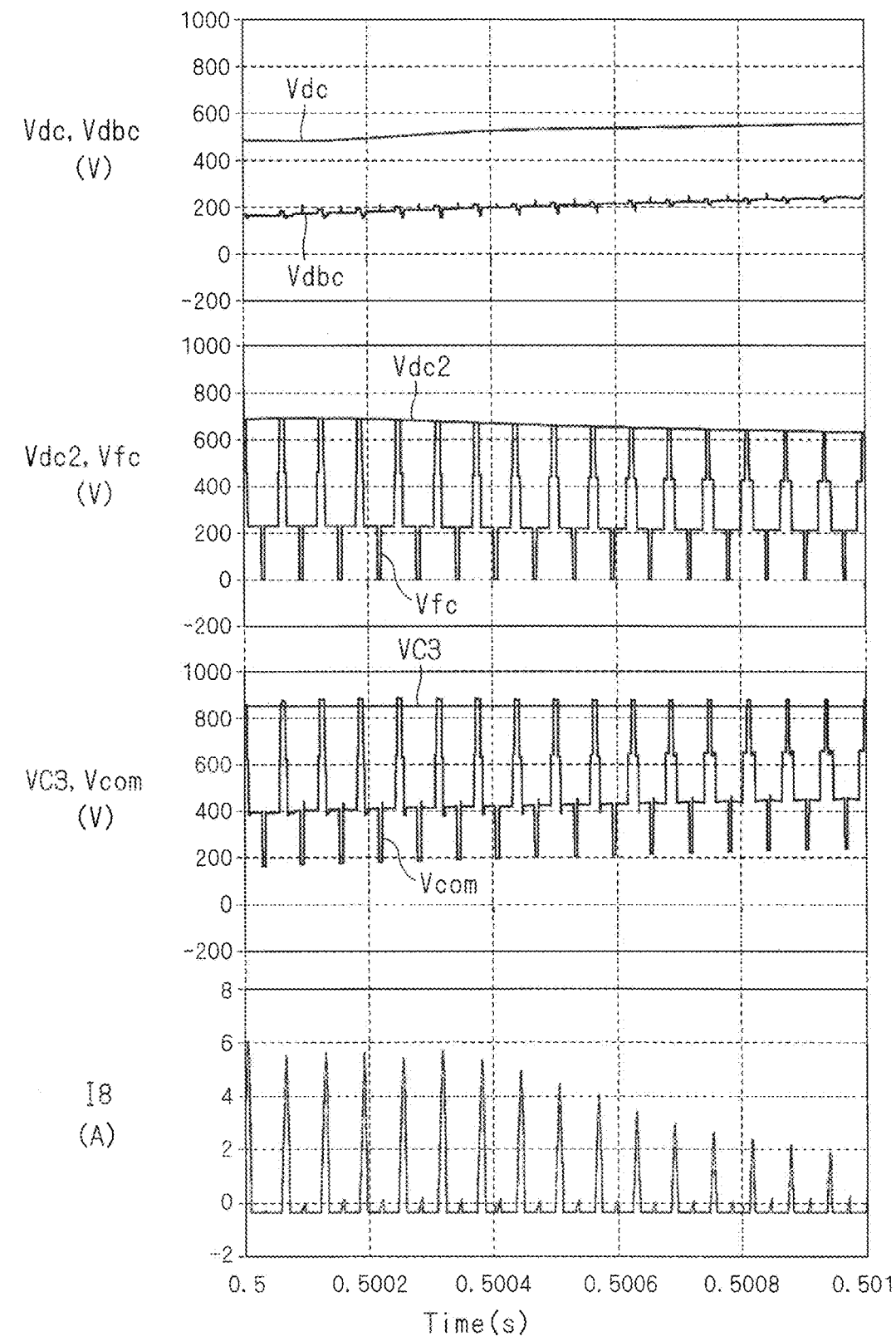
FIG. 29 is a graph explaining a common mode noise in the sixth embodiment.

FIG. 29 is a graph explaining a common mode noise in the sixth embodiment. Here, a case where root mean square values of the voltages Vr, Vs and Vt are 400 V is illustrated. The DC voltage Vdc exhibits a waveform smoothed by the function of the low-pass filter 22. On the other hand, the common mode voltage Vdbc exhibits fine fluctuations in a vicinity of 200 V. Note that, in the diode bridge 21, either one of the upper arm-side diode and the lower arm-side diode, which are connected in series to each other, conducts, and accordingly, the common mode voltage Vdbc becomes approximately ⅓ of the DC voltage Vdc.

The voltage Vdc2 exhibits an envelope that connects upper limits of the common mode voltage Vfc to one another. The common mode voltage Vcom is a sum of the common mode voltages Vdbc and Vfc, and as seen from FIG. 27, corresponds to the common mode voltage of the voltage VC3. Hence, in a similar way to a behavior of the voltage Vdc2 to the common mode voltage Vfc, the voltage VC3 also exhibits an envelope that connects substantially upper limits of the common mode voltage Vcom to one another. However, the voltage VC3 is higher than the voltage Vdc2 by approximately Vdc/3.

Due to the common mode voltage Vcom, the voltage VC3 becomes higher in comparison with the voltage Vdc2, and the current I8 is also high. This results in requirement for a large power capacity to the clamping capacitor C3, and prevents the clamp circuit 8, and eventually the whole of the active filter from being configured to a compact size at a low price.

Figure 30:
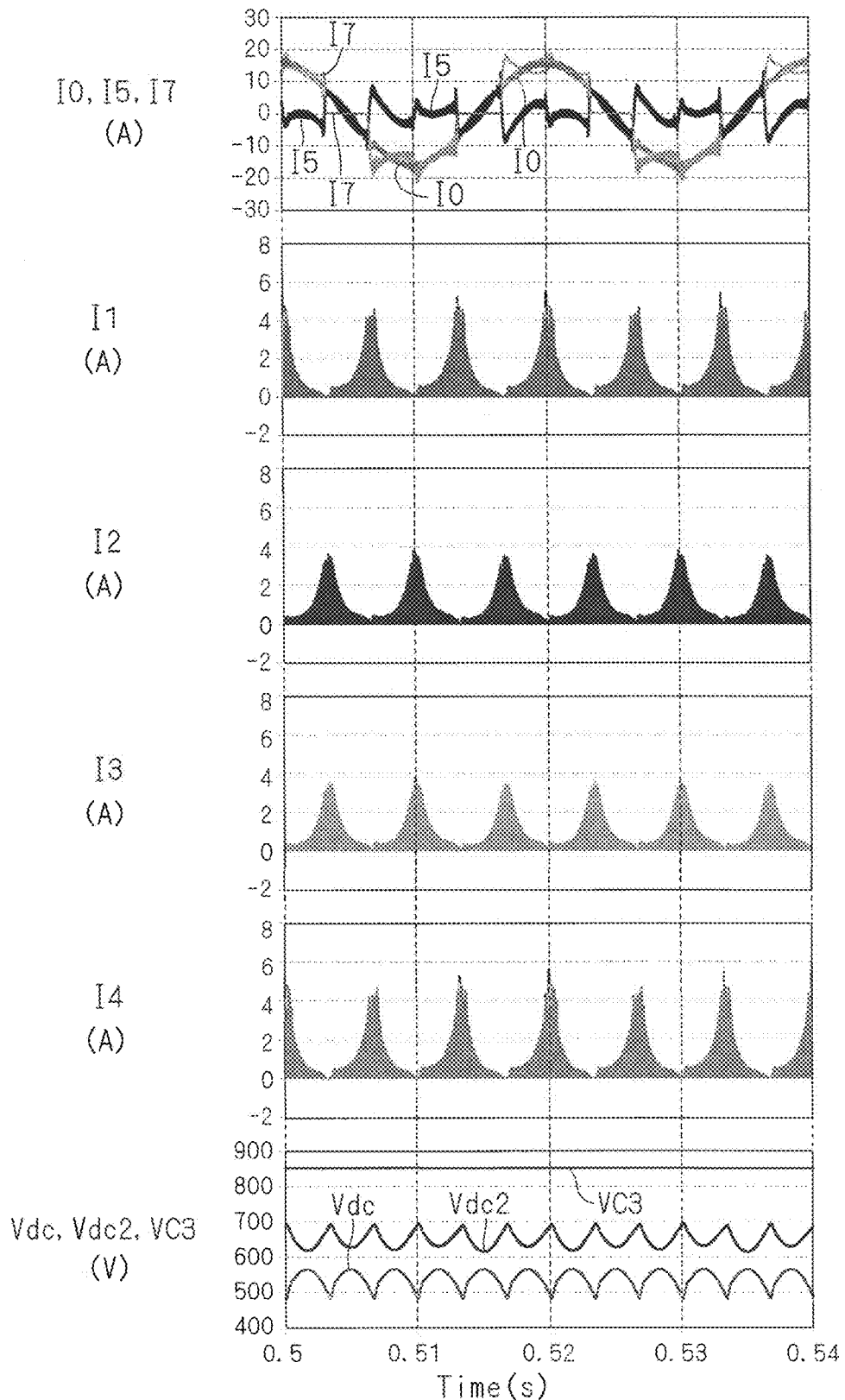
FIG. 30 is a graph showing currents and voltages of the respective portions in the motor drive system in which the active filter according to the sixth embodiment is adopted.

Note that a variety of amounts viewed in a more macroscopic time axis are shown in FIG. 30. Here, the currents I3 and I4 and the voltage VC3 are also shown besides the currents I0, I1, I2, I5 and I7, the DC voltage Vdc and the voltage Vdc2, which are already described in the fifth embodiment. However, in the graph of FIG. 30, a setting in which the DC voltage Vdc is different from that in the graph of FIG. 22 is adopted, and accordingly, waveforms are a little different.

FIG. 31 is a circuit diagram partially showing a configuration of an active filter according to a sixth embodiment. The configuration shown in FIG. 31 is different from the configuration (according to the fifth embodiment) shown in FIG. 26 in that a common mode choke L9 is added.

The common mode choke L9 includes reactors L91 and L92 which are inductively coupled to each other at the same polarity. The reactor L91 is connected in series to the diode D1 between the DC bus LH and one end (high potential side) of the capacitor C2. The reactor L92 is connected in series to the diode D2 between the DC bus LL and other end (low potential side) of the capacitor C2. Moreover, each of the reactors L91 and L92 is on a capacitor C2 side, or an opposite side to the capacitor C2, with respect to the clamping capacitor C3.

In FIG. 31, there is illustrated a case where the reactor L91 is connected between the clamping diode D3 and the high potential end of the capacitor C2, and the reactor L92 is connected between the clamping diode D4 and the low potential end of the capacitor C2. Hence, each of the reactors L91 and L92 is on the opposite side to the capacitor C2 with respect to the clamping capacitor C3.

FIG. 32 is a circuit diagram showing an equivalent circuit in the motor drive system in which the active filter according to the sixth embodiment is adopted. In a similar way to FIG. 27, FIG. 32 shows an equivalent circuit in which attention is paid to the common mode voltage.

In this equivalent circuit, the common mode choke L9 is disposed between the inverter 5 and the clamping capacitor C3, wherein a voltage V9 is generated in the same direction as that of the voltage VC3. In this way, the common mode voltage Vcom is canceled. Moreover, the common mode currents flowing through the currents I5 and I7 are also canceled, and the current I8 is also reduced.

FIG. 33 is a graph explaining the common mode noise in the sixth embodiment, showing the same variety of amounts as those of FIG. 29. It is seen that the current I8 is reduced, and that the voltage VC3 becomes substantially equal to the voltage Vdc2. Hence, the power capacity required for the clamping capacitor C3 is reduced.

Figure 34:
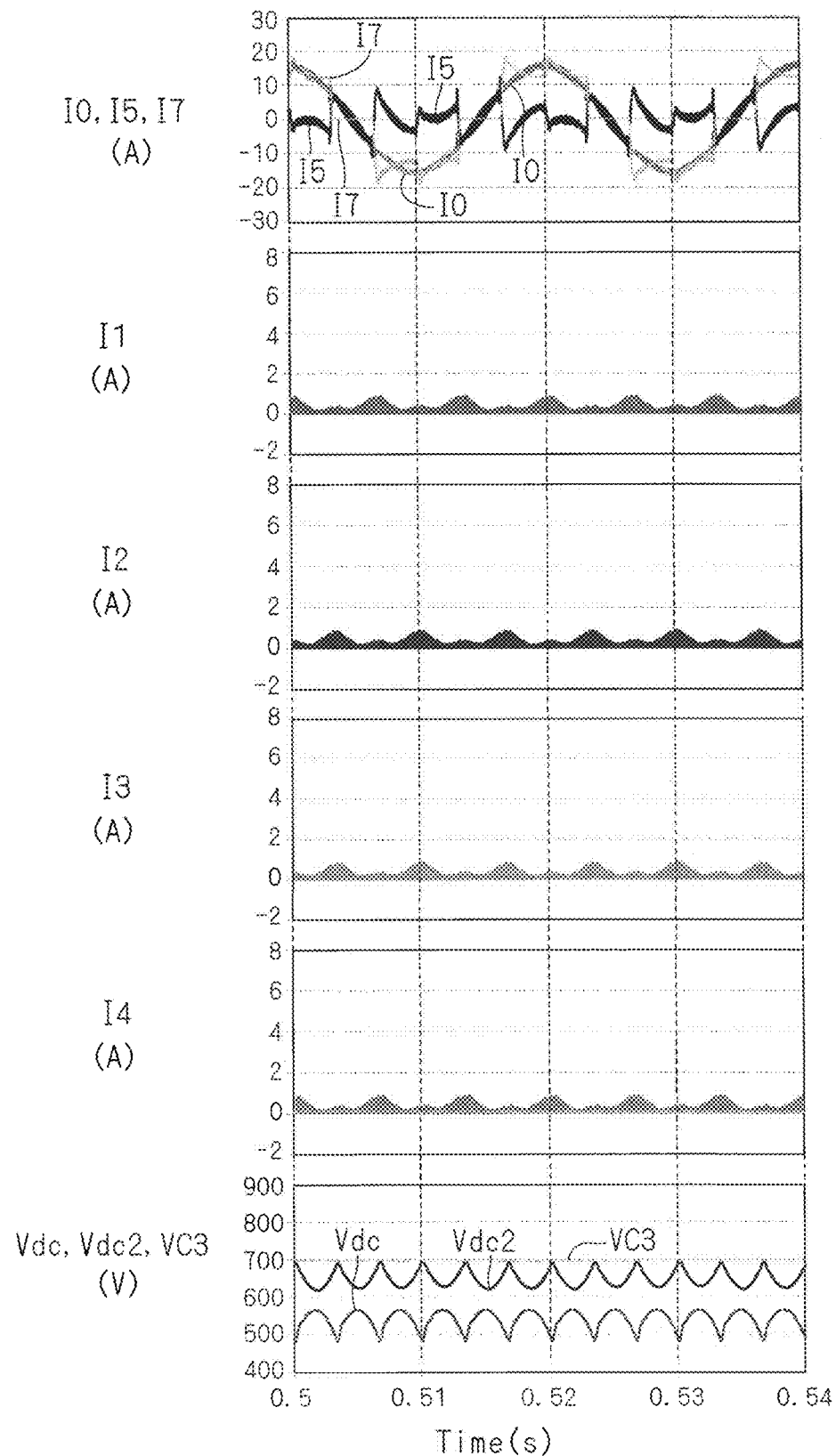
FIG. 34 is a graph showing currents and voltages of respective portions in the motor drive system in which the active filter according to the sixth embodiment is adopted.

FIG. 34 shows a variety of amounts viewed on a macroscopic time axis, showing the same variety of amounts as those of FIG. 30. It is seen that not only the voltage VC3 becomes substantially equal to the voltage Vdc2 but also the currents I1, I2, I3 and I4 are reduced. This is advantageous in a viewpoint that power capacities required for the diodes D1 and D2 and the clamping diodes D3 and D4 can be reduced.

When a turns ratio N of coils in the common mode choke L9 is introduced, a magnetic flux Φcmc flowing through the common mode choke L9 is represented by Equation (5). However, a symbol ∫ and a symbol dt indicate a time integration of an amount sandwiched between these two.

$$\Phi cmc=(1/N)\cdot\int V9\cdot dt \quad (5)$$

In a case where the common mode voltage Vfc is entirely applied to the common mode choke L9, a peak value Φpeak thereof is studied. However, for simplification, a description is made of a case of c<a<b(<Tsw/2) as shown in FIG. 28. This corresponds to a case of −π/6<α<π/6. In this case, the peak value Φpeak is obtained by Equation (6) with reference to FIG. 28. In a case where the inverter 5 operates on the three-phase sinusoidal wave modulation, the magnetic flux Φcmc becomes a periodic function that takes π/6 as a cycle for the phase α. In FIG. 28, the magnetic flux Φcmc is also shown.

$$\Phi peak=(1/N)\cdot[(Vdc2/2)(c-0)+(Vdc2/3)(a-c)]=(Vdc2/N)\cdot(c/6+a/3) \quad (6)$$

The time when the peak value Φpeak becomes maximum is when the modulation factor K becomes 0, and is a case where all of the upper arm-side switching elements of the inverter 5 are on and all of the lower arm-side switching elements thereof are off, or is a case where all of the upper arm-side switching elements are off and all of the lower arm-side switching elements are on. At this time, a=b=c=Tsw/4 is established, and the peak value Φpeak is represented by Equation (7).

$$\Phi\text{peak}=(1/N)\cdot(Vdc2/2)\cdot(Tsw/4)=(Vdc2\cdot Tsw)/(8\cdot N) \quad (7)$$

When the common mode choke L9 includes a core, it is desired that a saturation magnetic flux of the core be selected to be larger than the peak value Φpeak represented by Equation (7). That is, with regard to the core, as the voltage Vdc2 is higher, and as the frequency of the carrier CW is higher (this leads to that a switching frequency of the inverter 5 is high), the saturation magnetic flux required for the core of the common mode choke L9 is also increased.

Figure 35:
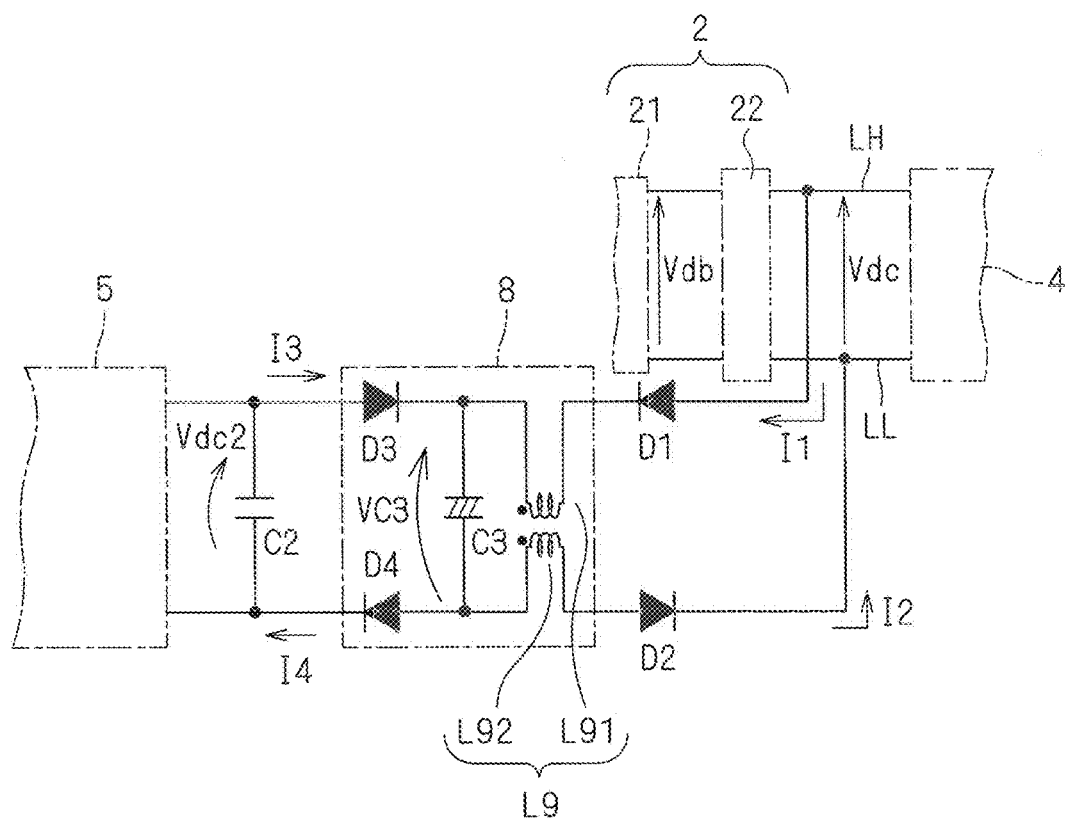
FIG. 35 is a circuit diagram partially showing a configuration of an active filter serving as a sixth modification example.

FIG. 35 is a circuit diagram partially showing a configuration of an active filter serving as a sixth modification example. The sixth modification example is different from the sixth embodiment in a position of the common mode choke L9 with respect to the clamp circuit 8.

Specifically, the common mode choke L9 in the sixth modification example also includes the reactors L91 and L92 which are inductively coupled to each other at the same polarity. Then, the reactor L91 is connected in series to the diode D1 between the DC bus LH and the high potential end of the capacitor C2, and the reactor L92 is connected in series to the diode D2 between the DC bus LL and the low potential end of the capacitor C2. However, the reactor L91 is provided between the clamping diode D3 and the diode D1 on a farther side from the capacitor C2 than the clamping capacitor C3. Moreover, the reactor L92 is provided between the clamping diode D4 and the diode D2 on the farther side from the capacitor C2 than the clamping capacitor C3. Hence, each of the reactors L91 and L92 is on the opposite side to the capacitor C2 with respect to the clamping capacitor C3.

It is obvious that, even in such a configuration, the common mode choke L9 functions in a similar way to that of the sixth embodiment, and achieves functions and effects, which are similar to those thereof. Reasons for the above are: that an equivalent circuit of the sixth modification example is one in which a position of the clamping capacitor C3 and a position of the common mode choke L9 are interchanged with each other in the equivalent circuit shown in FIG. 32; that the clamping capacitor C3 and the common mode choke L9 are in a relationship of being connected in series to each other; and that, even if two elements connected in series to each other are interchanged with each other, functions and effects, which are given by a configuration in which the two elements are interchanged with each other to an outside of such a serial connection, are not changed.

Figure 37:
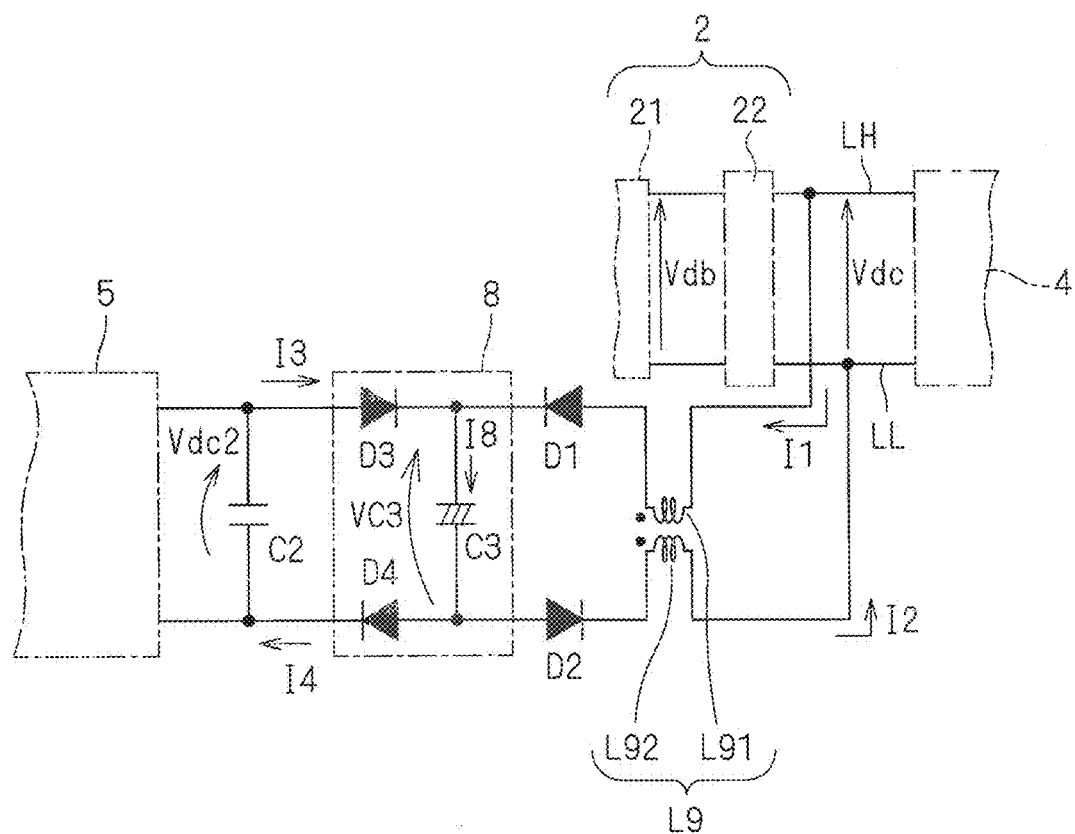
FIG. 37 is a circuit diagram partially showing a configuration of an active filter serving as an eighth modification example.
Figure 38:
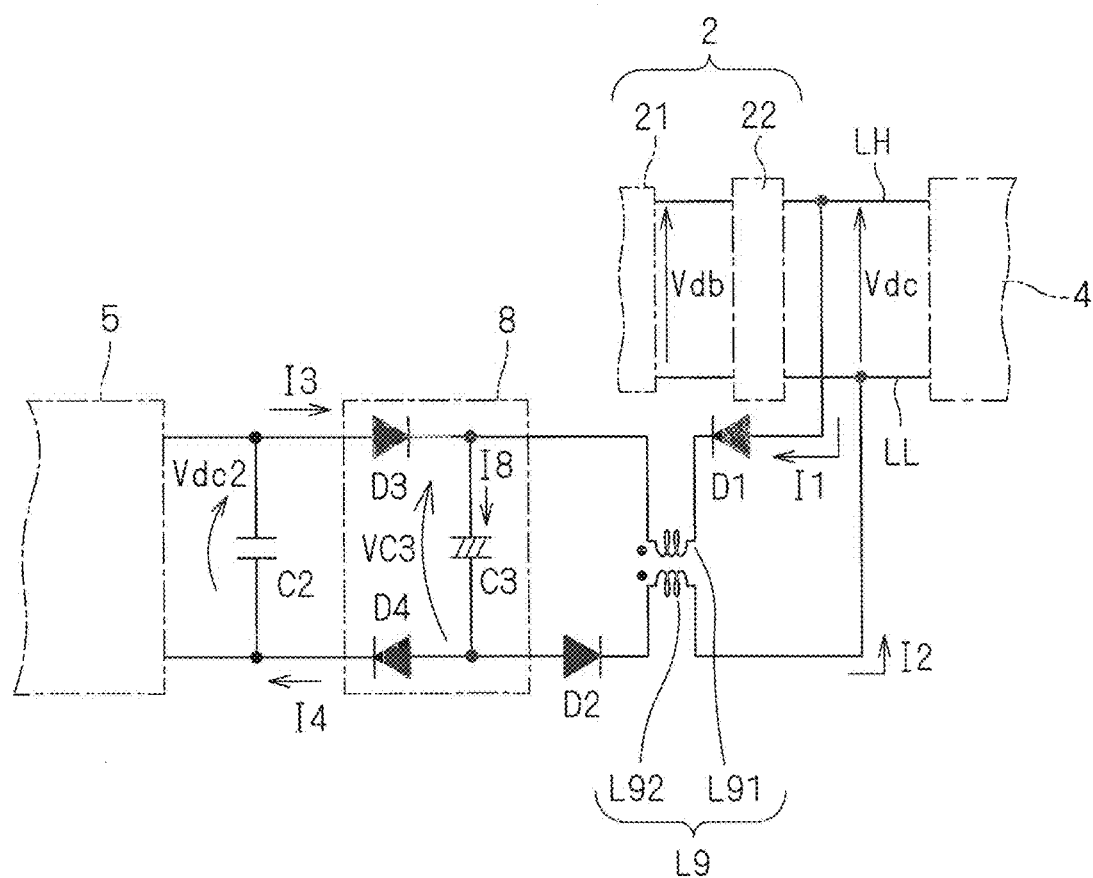
FIG. 38 is a circuit diagram partially showing a configuration of an active filter serving as a ninth modification example.

FIG. 36, FIG. 37 and FIG. 38 are circuit diagrams partially showing configurations of active filters serving as a seventh modification example, an eighth modification example and a ninth modification example, respectively. The seventh to ninth modification examples are different from the sixth embodiment in the position of the common mode choke L9 with respect to the clamp circuit 8.

Specifically, the common mode choke L9 in each of the seventh to ninth modification examples also includes the reactors L91 and L92 which are inductively coupled to each other at the same polarity. Then, the reactor L91 is connected in series to the diode D1 between the DC bus LH and the high potential end of the capacitor C2, and the reactor L92 is connected in series to the diode D2 between the DC bus LL and the low potential end of the capacitor C2.

However, in the seventh modification example, the reactor L91 is provided between the clamping diode D3 and the diode D1 on a closer side to the capacitor C2 than the clamping capacitor C3. Moreover, the reactor L92 is provided between the clamping diode D4 and the diode D2 on the closer side to the capacitor C2 than the clamping capacitor C3. Hence, each of the reactors L91 and L92 is on the capacitor C2 side with respect to the clamping capacitor C3.

In the eighth modification example, the reactor L91 is provided between the DC bus LH and the diode D1. Moreover, the reactor L92 is provided between the DC bus LL and the diode D2. Hence, each of the reactors L91 and L92 is on the opposite side to the capacitor C2 with respect to the clamping capacitor C3.

In the ninth modification example, the reactor L91 is provided between the clamping diode D3 and the diode D1 on a farther side from the capacitor C2 than the clamping capacitor C3. Moreover, the reactor L92 is provided between the DC bus LL and the diode D2. Hence, each of the reactors L91 and L92 is on the opposite side to the capacitor C2 with respect to the clamping capacitor C3.

Alternatively, the reactor L91 may be provided between the DC bus LH and the diode D1, and the reactor L92 may be provided between the clamping diode D4 and the diode D2 on a farther side form the capacitor C2 than the clamping capacitor C3.

Figure 39:
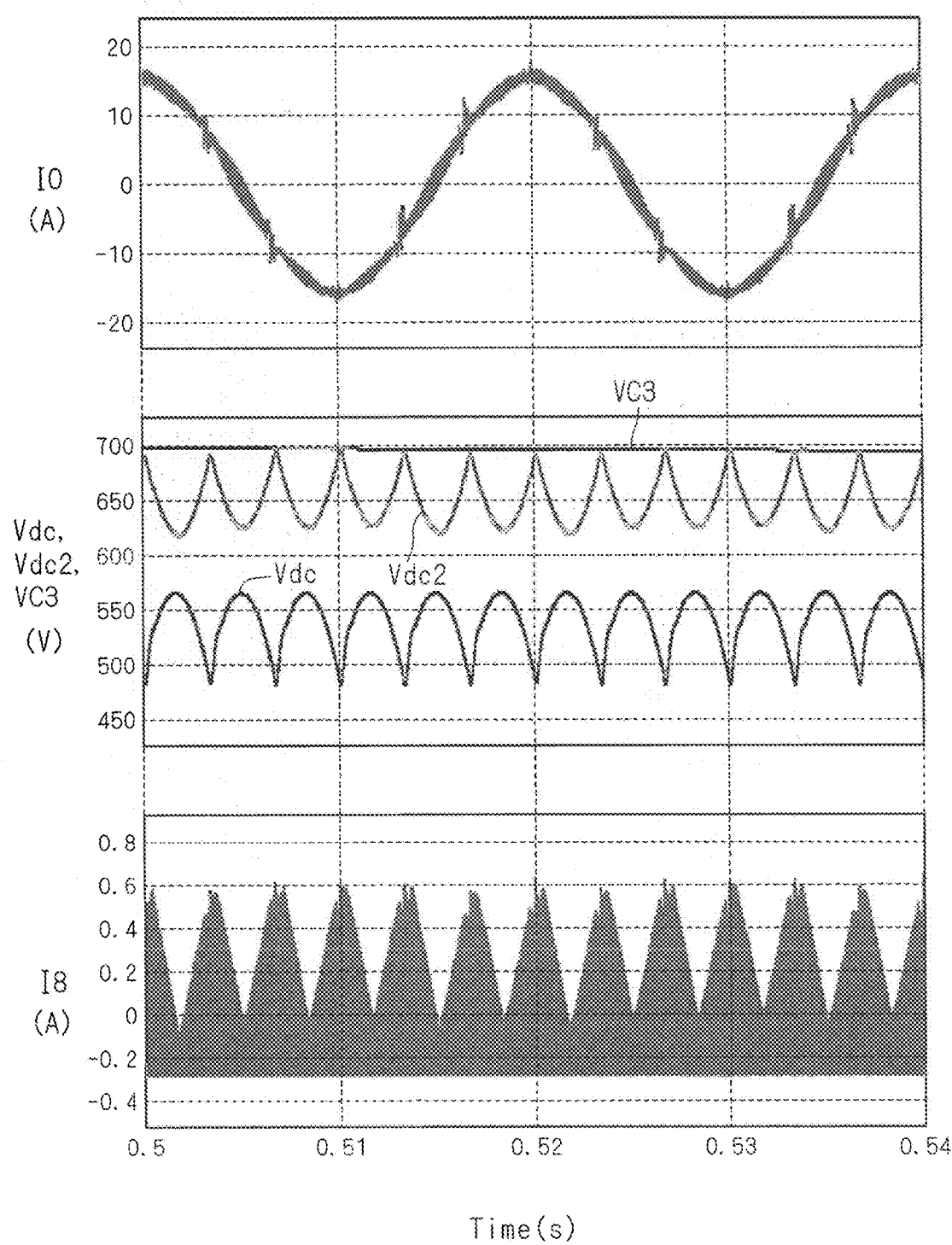
FIG. 39 is a graph showing currents and voltages of respective portions in a motor drive system in which the active filter according to the seventh modification example is adopted.
Figure 40:
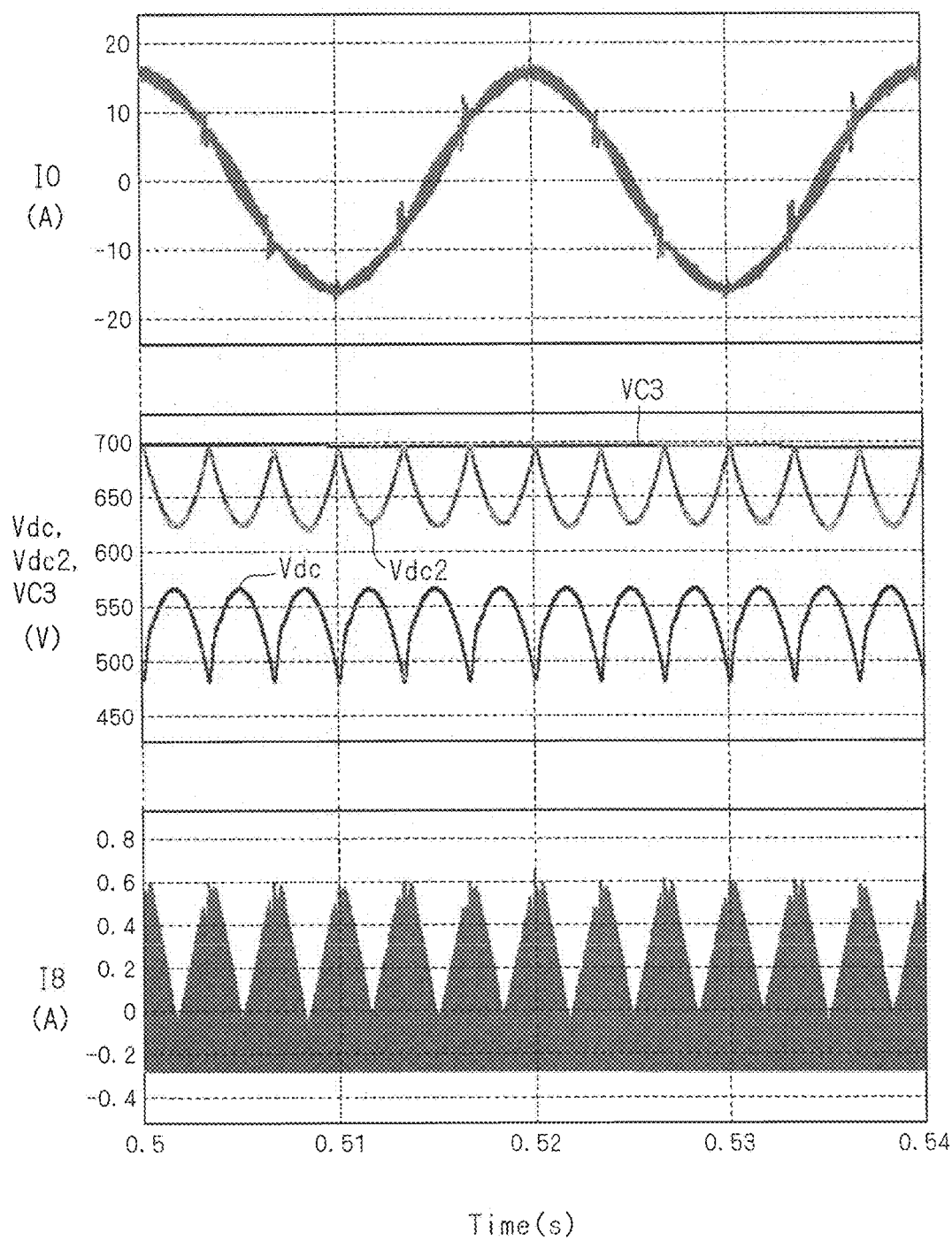
FIG. 40 is a graph showing currents and voltages of the respective portions in the motor drive system in which the active filter according to the eighth modification example is adopted.

FIG. 39, FIG. 40 and FIG. 41 are graphs showing currents and voltages of respective portions in motor drive systems in which the active filters according to the seventh modification example, the eighth modification example and the ninth modification example are adopted, respectively. Specifically, the currents I0 and I8 and the voltages Vdc, Vdc2 and VC3 are shown. Also in these modification examples, the voltage VC3 is suppressed to approximately the voltage Vdc2 in a similar way to the sixth embodiment (refer to FIG. 34).

In each of the sixth embodiment and the sixth to ninth modification examples, a configuration is shown, in which the common mode choke L9 is added to the fifth embodiment. However, the common mode choke L9 may be added to the fourth embodiment. In other words, the clamping diode D4 may be omitted from each of the sixth embodiment and the sixth to ninth modification examples.

Figure 42:
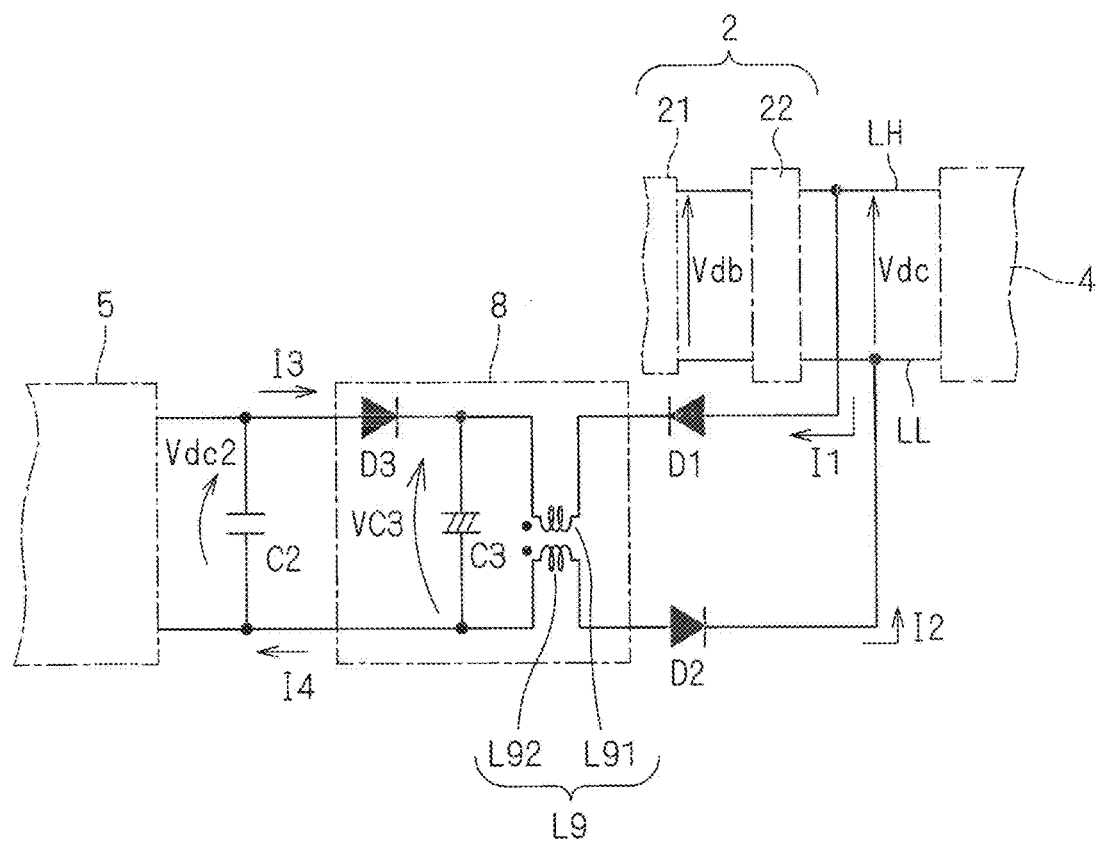
FIG. 42 is a circuit diagram partially showing a configuration of an active filter serving as a tenth modification example.
Figure 43:
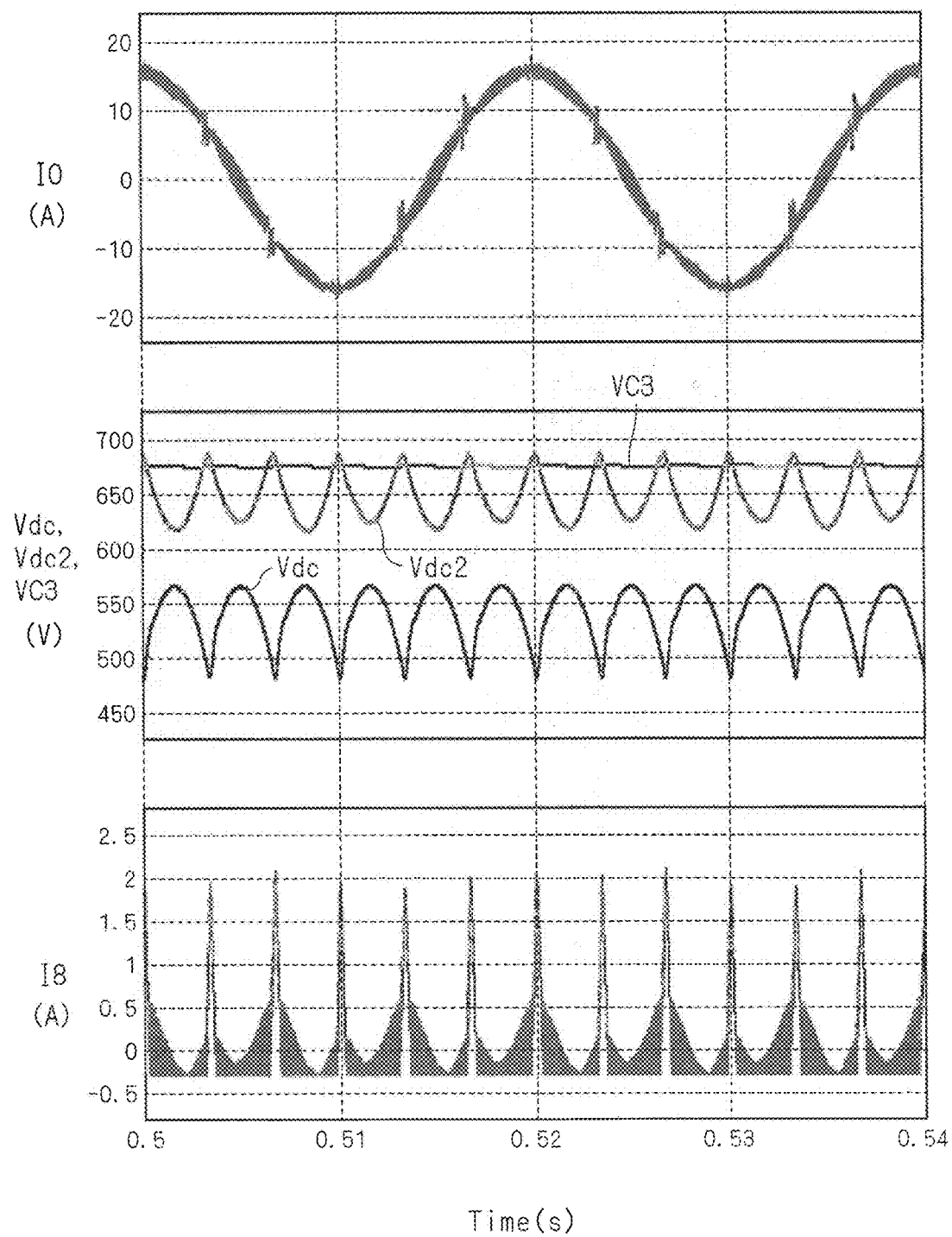
FIG. 43 is a graph showing currents and voltages of respective portions in the motor drive system in which the active filter according to the tenth modification example is adopted.

FIG. 42 is a circuit diagram partially showing a configuration of a tenth modification example, which is obtained by short-circuiting and removing the clamping diode D4 in the sixth modification example. FIG. 43 is a graph showing currents and voltages of respective portions in a motor drive system in which an active filter according to the tenth modification example is adopted, and specifically, showing the currents I0 and I8 and the voltages Vdc, Vdc2 and VC3.

In the tenth modification example, though there are time regions where the current I8 is increased since the clamping diode D4 is not present, an effect of suppressing the voltage VC3 to approximately the voltage Vdc2 is obtained in a similar way to the sixth modification example.

Indeed, in order to reduce the common mode voltage, it is also conceivable to provide three-phase common mode chokes, for example, in three-phase paths through which the current I5 flows, or in three-phase paths through which the current I7 flows.

However, in comparison with such a case, in the sixth embodiment or the sixth modification example, such a single-phase common mode choke L9 with a small current capacity is sufficient. This is advantageous in a viewpoint that the whole of the active filter, and eventually, the motor drive system that adopts the active filter can be configured to a compact size at a low price.

Note that, though the diode D2 is adopted in the sixth embodiment and the sixth to tenth modification examples, the resistor R2 may be adopted in place of this in a similar way to the modification of the fifth modification example to the fifth embodiment.

In each of the fifth embodiment, the sixth embodiment and the sixth to tenth modification examples, a resistor may be connected in series to the clamping capacitor C3 so that the current I8 cannot be fluctuated steeply.

Such a configuration including the above-mentioned active filter and the rectifier circuit 2 can be understood as the AC-DC conversion device.

While the present invention has been described in detail, the foregoing description is in all aspects illustrative and not restrictive. It is therefore understood that numerous modification examples that have not been described can be devised without departing from the scope of the present invention.

The invention claimed is:

1. An active filter connected in parallel to a rectifier circuit between a set of AC input lines and a pair of DC buses between which a load is connected, said rectifier circuit rectifying AC voltages inputted from said set of AC input lines and outputting a DC voltage to said pair of DC buses, said active filter comprising:
   a first capacitor;
   a pair of current limiting elements, each of which connects each of a pair of ends of said first capacitor to each of said pair of DC buses, and at least one of which is a diode disposed in an orientation to be forward with respect to said DC voltage; and
   an inverter including a set of AC-side terminals connected to said set of AC input lines, a pair of DC-side terminals connected to both ends of said first capacitor, a plurality of switching elements, each of which connects each of said AC-side terminals and each of said DC-side terminals to each other, and a plurality of diodes, each of which is connected in anti-parallel to each of said switching elements.

2. The active filter according to claim 1, wherein each of said pair of current limiting elements is the diode disposed in the orientation to be forward with respect to the DC voltage.

3. An AC-DC conversion device comprising: the active filter according to claim 2; and said rectifier circuit.

4. The active filter according to claim 1, wherein other in said pair of current limiting elements is a resistor.

5. An AC-DC conversion device comprising: the active filter according to claim 4; and said rectifier circuit.

6. The active filter according to claim 1,
   wherein said rectifier circuit includes a diode bridge and a low-pass filter,
   said low-pass filter is provided between said diode bridge and said pair of DC buses,
   said diode bridge is provided between said set of AC input lines and said low-pass filter, and
   said low-pass filter includes: a first reactor provided between one in said pair of DC buses and said diode bridge; a second reactor provided between other in said pair of DC buses and said diode bridge; and a second capacitor provided between said pair of DC buses.

7. An AC-DC conversion device comprising: the active filter according to claim 6; and said rectifier circuit.

8. An AC-DC conversion device comprising: the active filter according to claim 1; and said rectifier circuit.

9. An active filter connected in parallel to a rectifier circuit between a set of AC input lines and a pair of DC buses between which a load is connected, said rectifier circuit rectifying AC voltages inputted from said set of AC input lines and outputting a DC voltage to said pair of DC buses, said active filter comprising:
   a first capacitor;
   a pair of current limiting elements, each of which connects each of a pair of ends of said first capacitor to each of said pair of DC buses, and at least one of which is a diode disposed in an orientation to be forward with respect to said DC voltage;
   an inverter including a set of AC-side terminals connected to said set of AC input lines, a pair of DC-side terminals connected to both ends of said first capacitor, a plurality of switching elements, each of which connects each of said AC-side terminals and each of said DC-side terminals to each other, and a plurality of diodes, each of which is connected in anti-parallel to each of said switching elements; and
   a clamp circuit, which is provided between said first capacitor and said pair of current limiting elements, and includes at least one of clamping diodes reverse to said DC voltage, and a clamping capacitor connected in parallel to said first capacitor via said clamping diode more on said first capacitor side than said one in said pair of current limiting elements,
   wherein said pair of current limiting elements are connected in series to said clamping capacitor between said pair of DC buses, and
   said one in said pair of current limiting elements is connected to one in a pair of ends of said first capacitor via said clamping diode.

10. The active filter according to claim 9, wherein said clamp circuit further includes other clamping diode, which is connected in series to said clamping diode and said clamping capacitor between said pair of ends of said first capacitor and is reverse to said DC voltage.

11. The active filter according to claim 10, further comprising:
   a third reactor and a fourth reactor, which are inductively coupled to each other at a same polarity, wherein
   said third reactor is connected in series to said one in said pair of current limiting elements between said one in said pair of ends of said first capacitor and one in said DC buses,
   said fourth reactor is connected in series to other in said pair of current limiting elements between other in said pair of ends of said first capacitor and other in said DC buses, and
   each of said third reactor and said fourth reactor is on said first capacitor side with respect to said clamping capacitor, or on an opposite side to said first capacitor.

12. An AC-DC conversion device comprising: the active filter according to claim 11; and said rectifier circuit.

13. An AC-DC conversion device comprising: the active filter according to claim 10; and said rectifier circuit.

14. The active filter according to claim 9, further comprising:
   a third reactor and a fourth reactor, which are inductively coupled to each other at a same polarity, wherein
   said third reactor is connected in series to said one in said pair of current limiting elements between said one in said pair of ends of said first capacitor and one in said DC buses, said fourth reactor is connected in series to other in said pair of current limiting elements between other in said pair of ends of said first capacitor and other in said DC buses, and each of said third reactor and said fourth reactor is on said first capacitor side with respect to said clamping capacitor, or on an opposite side to said first capacitor.

15. An AC-DC conversion device comprising: the active filter according to claim 14; and said rectifier circuit.

16. An AC-DC conversion device comprising: the active filter according to claim 9; and said rectifier circuit.

* * * * *